United States Patent
Hangaishi

(10) Patent No.: US 7,304,506 B2
(45) Date of Patent: Dec. 4, 2007

(54) DIFFERENTIAL OUTPUT CIRCUIT AND SEMICONDUCTOR DEVICE HAVING THE SAME

(75) Inventor: Makoto Hangaishi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 11/360,630

(22) Filed: Feb. 24, 2006

(65) Prior Publication Data

US 2006/0192588 A1  Aug. 31, 2006

(30) Foreign Application Priority Data

Feb. 28, 2005  (JP) .............................. 2005-053822

(51) Int. Cl.
*H03K 19/0175*  (2006.01)
*H03K 19/094*  (2006.01)

(52) U.S. Cl. ..................... 326/87; 326/82; 326/83; 326/86; 327/65; 327/537

(58) Field of Classification Search .................. 326/82, 326/83, 86, 87
See application file for complete search history.

(56) References Cited

FOREIGN PATENT DOCUMENTS

| JP | 3202196 B2 | 6/2001 |
| JP | 2004-31407 A | 1/2004 |
| JP | 2004-112453 A | 4/2004 |
| JP | 2004-215137 A | 7/2004 |

*Primary Examiner*—Rexford Barnie
*Assistant Examiner*—Crystal L Hammond
(74) *Attorney, Agent, or Firm*—Dickstein Shapiro LLP

(57) ABSTRACT

A differential output circuit first and second transistors forming a differential pair and having control electrodes input with binary signals, a constant current circuit supplying a constant current to the first and second transistors, and a protection circuit protecting the first and second transistors from external noise. The protection circuit has transistors respectively coupled in parallel to the first and second transistors and input with a first power supply voltage, and transistors respectively coupled between a second power supply voltage and first and second output terminals of the differential output circuit.

22 Claims, 15 Drawing Sheets

DIFFERENTIAL OUTPUT CIRCUIT AND SEMICONDUCTOR DEVICE HAVING THE SAME

BACKGROUND OF THE INVENTION

1. Field of the Invention

The present invention generally relates to differential output circuits and semiconductor devices, and more particularly to a differential output circuit that is used in a driver circuit for a high-speed low-amplitude differential output interface, and to a semiconductor device having such a differential output circuit.

2. Description of the Related Art

Conventionally, differential output circuits used in driver circuits for high-speed low-amplitude differential output interfaces include Current Mode Logic (CML) circuits shown in FIGS. 1 and 2 and Low Voltage Difference Signaling (LVDS) circuits such as that shown in FIG. 3. In cases where such differential output circuits are used in driver circuits of semiconductor integrated circuits such as ICs and LSIs for high-speed signal transmission apparatuses as shown in FIGS. 4 through 6, an output signal must be output from the differential output circuit to the outside of the differential output circuit. For this reason, input/output cells including pad portions that connect to terminals of an IC package via wires are connected to an output part of the differential output circuit. In such input/output cells, a protection element or a protection circuit is used to prevent deterioration or damage to the semiconductor integrated circuit caused by surge or Electro-Static Discharge (ESD).

In FIGS. 1 through 6, the same designations are used for the circuit elements. VCC1 and VCC2 denote power supplies or power supply voltages, GND denotes the ground or ground voltage, and VA and VB denote control inputs.

FIGS. 4 and 5 show cases where the input/output cells are connected to the CML circuit shown in FIG. 2 using N-channel MOS transistors (hereinafter simply referred to as NMOS transistors) as differential pair transistors.

In FIGS. 4 and 5, NMOS transistors N1 and N2 forming the differential input pair respectively operate in response to corresponding input signals Si1 and Si2, and a current flowing through an NMOS transistor N3 that forms a current source flows to one of the NMOS transistors N1 and N2. The input signals Si1 and Si2 are logic signals having mutually inverted logic signal levels. Output signal So1 and So2 that are output from corresponding first and second output terminals OUT1 and OUT2 respectively have amplitudes determined by currents flowing through corresponding resistors R1 and R2 and resistances of these resistors R1 and R2.

In FIG. 4, the resistors R1 and R2 are externally connected to the corresponding first and second output terminals OUT1 and OUT2, and are connected to a power supply VCC2 which is different from an internal power supply VCC1. But if the internal power supply VCC1 can be used, it is possible to use it as a common power supply instead of using the two power supplies VCC1 and VCC2.

In FIG. 5, the resistors R1 and R2 are internally connected to the corresponding first and second output terminals OUT1 and OUT2, and are connected to the internal power supply VCC1. However, it is possible to use a different power supply VCC2 in place of the internal power supply VCC1.

FIG. 6 shows a case where the input/output cells are connected to the LVDS circuit shown in FIG. 3 using N-channel MOS transistors as differential pair transistors and P-channel MOS transistors (hereinafter simply referred to as PMOS transistors) as differential pair transistors.

In FIG. 6, NMOS transistors N1 and N2 forming the differential pair respectively operate in response to corresponding input signals Si1 and Si2, and PMOS transistors P1 and P2 forming the differential pair respectively operate in response to the corresponding input signals Si1 and Si2. A current flowing through an NMOS transistor N3 that forms a current source flows to one of the NMOS transistors N1 and N2 or, a current flowing through a PMOS transistor P3 that forms a current source flows to one of the PMOS transistors P1 and P2.

Generally, the input signals Si1 and Si2 have logic levels such that the current flows to the PMOS transistor P2 when the current flows through the NMOS transistor N1, and the current flows to the PMOS transistor P1 when the current flows through the NMOS transistor N2. The current flowing through the PMOS transistor P3 and the current flowing through the NMOS transistor N3 have approximately the same current values.

The output signals So1 and So2 that are output from the corresponding first and second output terminals OUT1 and OUT2 have amplitudes determined by the voltage generated by the current flowing through a resistor R4 that is connected between the first and second output terminals OUT1 and OUT2.

FIG. 7 is a circuit diagram showing an example of a conventional low-amplitude differential output circuit applied with the case shown in FIG. 4. In FIG. 7, a first power supply voltage is the ground voltage GND, a second power supply voltage is VCC1, and a third power supply voltage is VCC2.

A low-amplitude differential output circuit 100 shown in FIG. 7 includes NMOS transistors N1 and N2 forming a differential pair, resistors R1 and R2 forming loads of the corresponding NMOS transistors N1 and N2, a constant current circuit 101 for supplying a predetermined constant current to the NMOS transistors N1 and N2, and an input control circuit 102 for generating signals Si1 and Si2 having mutually inverted logic levels (or complementary logic signal levels) based on an input signal Si which is a logic signal.

The input logic signal Si that is input to the low-amplitude differential output circuit 100 is converted into the 2 kinds of logic signals Si1 and Si2 having the mutually inverted logic signal levels by the input control circuit 102, and the logic signals Si1 and Si2 are input to the gates of the corresponding NMOS transistors N1 and N2 forming the differential pair.

The constant current circuit 101 carries out a current conversion with respect to an external reference voltage V1 via an operational amplifier AMP, a resistor, a PMOS transistor P11 and an NMOS transistor N11. Since the reference voltage V1 is stable, a constant current is obtained by this current conversion. The constant current is supplied to the NMOS transistors N1 and N2 via PMOS transistors P11 and P12 forming a current mirror circuit and NMOS transistors N3 and N12 forming a current mirror circuit.

The currents flowing through the NMOS transistors N1 and N2 are switched depending on the logic signals Si1 and Si2 from the input control circuit 102. A resistor R1 is connected between a first output terminal OUT1 and the third power supply voltage VCC2, and a resistor R2 is connected between a second output terminal OUT2 and the third power supply voltage VCC2. Amplitudes of output signals So1 and So2 are determined from the currents flowing through the NMOS transistors N1 and N2 and the resistances of the resistors R1 and R2.

Since the first and second output terminals OUT1 and OUT2 are directly connected to an external circuit, input/output cells IO1 and IO2 each including a pad and a protection element for preventing electrostatic damage are connected to the corresponding first and second output terminals OUT1 and OUT2. The circuit elements shown in FIG. 7, excluding the resistors R1 and R2, are integrated within a single IC.

For example, a Japanese Patent No. 3202196 (issued from a Japanese Laid-Open Patent Application No. 2000-68813) proposes providing in parallel transistors forming a differential input pair of the differential output circuit and transistors having the sources thereof connected in common, so that the transistors operate during a normal operation of the differential output circuit.

A Japanese Laid-Open Patent Application No. 2004-215137 proposes providing in parallel to an input transistor pair of the differential output circuit transistors for amplifying a high-frequency component.

A Japanese Laid-Open Patent Application No. 2004-31407 proposes a CML circuit using 2 circuits having the same structure as a countermeasure against inconsistencies introduced during the production process of the differential output circuit.

A Japanese Laid-Open Patent Application No. 2004-112453 proposes a transmission apparatus operating at low voltages.

Recently, in high-speed interfaces, there are demands to increase the operation speed of the low-amplitude differential output circuit. In the case of the circuit shown in FIG. 7, the input/output cells IO1 and IO2 for preventing electrostatic damage are connected to the corresponding first and second output terminals OUT1 and OUT2 which form differential output terminals. For this reason, as the operation speed of the low-amplitude differential output circuit increases, the operation speed deteriorates due to the effects of the protection element within the input/output cells IO1 and IO2 and the effects of a parasitic element in the vicinity of the protection element.

As for the quality of the differential output, an error is generated in the waveform of the differential output from the first and second output terminals OUT1 and OUT2 due to inconsistencies, generated during the production process, of the internal cells and the parasitic elements in the vicinity of the internal cells, between the input/output cells IO1 and IO2 that are connected to the corresponding first and second output terminals OUT1 and OUT2.

In an integrated circuit having a large scale as in the case of the LSI, the scale of the circuit and functions within the circuit is large, and a large number of input/output cells are used because the package has a large number of terminals or pads for the integrated circuit. Accordingly, when using the low-amplitude differential output circuit shown in FIG. 7 in the integrated circuit, it is necessary to develop special input/output cells that are different from peripheral input/output cells, as the input/output cells for the driver circuit. Consequently, in addition to the time required to develop the internal circuits to be provided in the integrated circuit, additionally time is required to develop the special input/output cells.

Generally, a resistor or a transistor is used as the protection element for preventing the electrostatic damage. But when the transistor is used as the protection element, the transistor and the parasitic element in the vicinity of the transistor affect the high-speed characteristic of the integrated circuit. When a resistor is connected between the pad and each output terminal producing the differential output of the low-amplitude differential output circuit, the high-speed characteristic of the low-amplitude differential output circuit is affected by the parasitic element in the vicinity of the resistor and the increase in circuit area caused by the provision of the resistor. In addition, in the case of the circuit shown in FIG. 7, the connection of the resistor reduces a drain-source current of the NMOS transistor N3 forming the current mirror circuit, and the constant current characteristic of the constant current circuit 101 deteriorates because the operation of the NMOS transistor N3 changes from a 5-active (or 5-saturation) region operation to a 3-active (or 3-saturation) region operation.

In addition, in a case where a resistor is connected between the pad and the output terminal for improving ESD withstand voltage, the circuit area increases due to the additional provision of the resistor, and the operation speed deteriorates due to the resistor and the parasitic element. As for the operation of the internal circuit, the operating range of the transistor within the differential output circuit decreases due to the additional provision of the resistor. For example, if the NMOS transistor N3 and the PMOS transistor P3 shown in FIGS. 4 through 7 form a current mirror circuit together with an external constant current circuit, a source-drain voltage for operating the NMOS transistor N3 and the PMOS transistor P3 in the 5-active (or 5-saturation) region is required, and in order to increase the source-drain voltage that is reduced due to the additional provision of the resistor, it is necessary to increase the transistor size of the NMOS transistor N3 and the PMOS transistor P3. Consequently, the circuit area increases in such a case.

Furthermore, the so-called silicide transistor having a thin oxide layer and reduced parasitic resistance in the periphery of the transistor is used to further improve the high-speed operation. On the other hand, such a silicide transistor is not used, and instead, a transistor having a thick oxide layer is used for the transistor within the input/output cell where the electrostatic and surge directly enter.

However, when the electrostatic or surge enters the input/output cell from the outside, the electrostatic or surge may not pass through the input/output cell and deteriorate the silicide transistor which has the thin oxide layer and the reduced parasitic resistance within the integrated circuit. Particularly the low-amplitude differential output circuit is easily affected by such electrostatic or surge, because the output part is directly connected to the pad.

Therefore, it is conceivable to increase the transistor size of the protection transistor which is provided within the input/output cell for the purpose of improving the ESD withstand voltage, so that the electrostatic or surge passes through the input/output cell. However, increasing the transistor size of the protection transistor will increase the parasitic resistance in the periphery of the protection transistor, to thereby cause the high-speed operation of the low-amplitude differential output circuit to deteriorate.

SUMMARY OF THE INVENTION

Accordingly, it is a general object of the present invention to provide a novel and useful differential output circuit and semiconductor device, in which the problems described above are suppressed.

Another and more specific object of the present invention is to provide a differential output circuit and a semiconductor device, which can prevent problems caused by electrostatic, surge and the like, improve the quality of the differential output signals and high-speed operation of the differential output circuit, and reduce the circuit area.

Still another and more specific object of the present invention is to provide a differential output circuit for generating a pair of binary signals having mutually inverted logic signal levels in response to an input signal and outputting the pair of signals via first and second output terminals, comprising a first transistor, coupled between the first output terminal and a predetermined first power supply voltage, and having a control electrode input with one of the binary signals; a second transistor, coupled between the second output terminal and the predetermined first power supply voltage, configured to form a differential pair with the first transistor and having a control electrode input with the other of the binary signals; a constant current circuit configured to generate a predetermined constant current that is supplied to the first and second transistors; and a protection circuit configured to protect the first and second transistors from external noise, wherein the protection circuit comprises a fifth transistor, coupled in parallel to the first transistor, and having a control electrode input with the first power supply voltage; a sixth transistor, coupled in parallel to the second transistor, and having a control electrode input with the first power supply voltage; an eighth transistor, coupled between the second power supply voltage and the first output terminal, and having a control electrode input with the second power supply voltage; and a ninth transistor, coupled between the second power supply voltage and the second output terminal, and having a control electrode input with the second power supply voltage. According to the differential output circuit of the present invention, it is possible to prevent problems caused by electrostatic, surge and the like, improve the quality of the differential output signals and high-speed operation of the differential output circuit, and reduce the circuit area.

A further object of the present invention is to provide a differential output circuit for generating a pair of binary signals having mutually inverted logic signal levels in response to an input signal and outputting the pair of signals via first and second output terminals, comprising a first transistor, coupled between the first output terminal and a predetermined first power supply voltage, and having a control electrode input with one of the binary signals; a second transistor, coupled between the second output terminal and the predetermined first power supply voltage, configured to form a differential pair with the first transistor and having a control electrode input with the other of the binary signals; a third transistor, coupled between the first output terminal and a predetermined second power supply voltage, having a control electrode input with the one of the binary signals; a fourth transistor, coupled between the second output terminal and the second power supply voltage, having a control electrode input with the other of the binary signals; a constant current circuit configured to generate a predetermined constant current that is supplied to the first and second transistors, and to generate a predetermined constant current that is supplied to the third and fourth transistors; and a protection circuit configured to protect the first, second, third and fourth transistors from external noise, wherein the protection circuit comprises a fifth transistor, coupled in parallel to the first transistor, and having a control electrode input with the first power supply voltage; a sixth transistor, coupled in parallel to the second transistor, and having a control electrode input with the first power supply voltage; an eighth transistor, coupled in parallel to the third transistor, and having a control electrode input with the second power supply voltage; and a ninth transistor, coupled in parallel to the fourth transistor, and having a control electrode input with the second power supply voltage.

According to the differential output circuit of the present invention, it is possible to prevent problems caused by electrostatic, surge and the like, improve the quality of the differential output signals and high-speed operation of the differential output circuit, and reduce the circuit area.

Another object of the present invention is to provide a semiconductor device comprising a differential output circuit configured to generate a pair of binary signals having mutually inverted logic signal levels in response to an input signal and outputting the pair of signals via first and second output terminals, the differential output circuit comprising a first transistor, coupled between the first output terminal and a predetermined first power supply voltage, and having a control electrode input with one of the binary signals; a second transistor, coupled between the second output terminal and the predetermined first power supply voltage, configured to form a differential pair with the first transistor and having a control electrode input with the other of the binary signals; a constant current circuit configured to generate a predetermined constant current that is supplied to the first and second transistors; and a protection circuit configured to protect the first and second transistors from external noise, wherein the protection circuit comprises a fifth transistor, coupled in parallel to the first transistor, and having a control electrode input with the first power supply voltage; a sixth transistor, coupled in parallel to the second transistor, and having a control electrode input with the first power supply voltage; an eighth transistor, coupled between the second power supply voltage and the first output terminal, and having a control electrode input with the second power supply voltage; and a ninth transistor, coupled between the second power supply voltage and the second output terminal, and having a control electrode input with the second power supply voltage. According to the semiconductor device of the present invention, it is possible to prevent problems caused by electrostatic, surge and the like, improve the quality of the differential output signals and high-speed operation of the differential output circuit, and reduce the circuit area.

Still another object of the present invention is to provide a semiconductor device comprising a differential output circuit configured to generate a pair of binary signals having mutually inverted logic signal levels in response to an input signal and outputting the pair of signals via first and second output terminals, the differential output circuit comprising a first transistor, coupled between the first output terminal and a predetermined first power supply voltage, and having a control electrode input with one of the binary signals; a second transistor, coupled between the second output terminal and the predetermined first power supply voltage, configured to form a differential pair with the first transistor and having a control electrode input with the other of the binary signals; a third transistor, coupled between the first output terminal and a predetermined second power supply voltage, having a control electrode input with the one of the binary signals; a fourth transistor, coupled between the second output terminal and the second power supply voltage, having a control electrode input with the other of the binary signals; a constant current circuit configured to generate a predetermined constant current that is supplied to the first and second transistors, and to generate a predetermined constant current that is supplied to the third and fourth transistors; and a protection circuit configured to protect the first, second, third and fourth transistors from external noise, wherein the protection circuit comprises a fifth transistor, coupled in parallel to the first transistor, and having a control electrode input with the first power supply voltage; a sixth transistor, coupled in parallel to the second transistor, and having a control electrode input with the first power supply voltage; an eighth transistor, coupled in parallel to the third transistor, and having a control electrode input with the second power supply voltage; and a ninth transistor, coupled in parallel to the fourth transistor, and having a control electrode input with the second power supply voltage. According to the semiconductor device of the present invention, it is possible to prevent problems caused by electrostatic, surge and the like, improve the quality of the differential output signals and high-speed operation of the differential output circuit, and reduce the circuit area.

Other objects and further features of the present invention will be apparent from the following detailed description when read in conjunction with the accompanying drawings.

DESCRIPTION OF THE PREFERRED EMBODIMENTS

A description will be given of embodiments of a differential output circuit according to the present invention and a semiconductor device according to the present invention having such a differential output circuit, by referring to FIG. 8 and the subsequent figures.

First Embodiment

Figure 8:
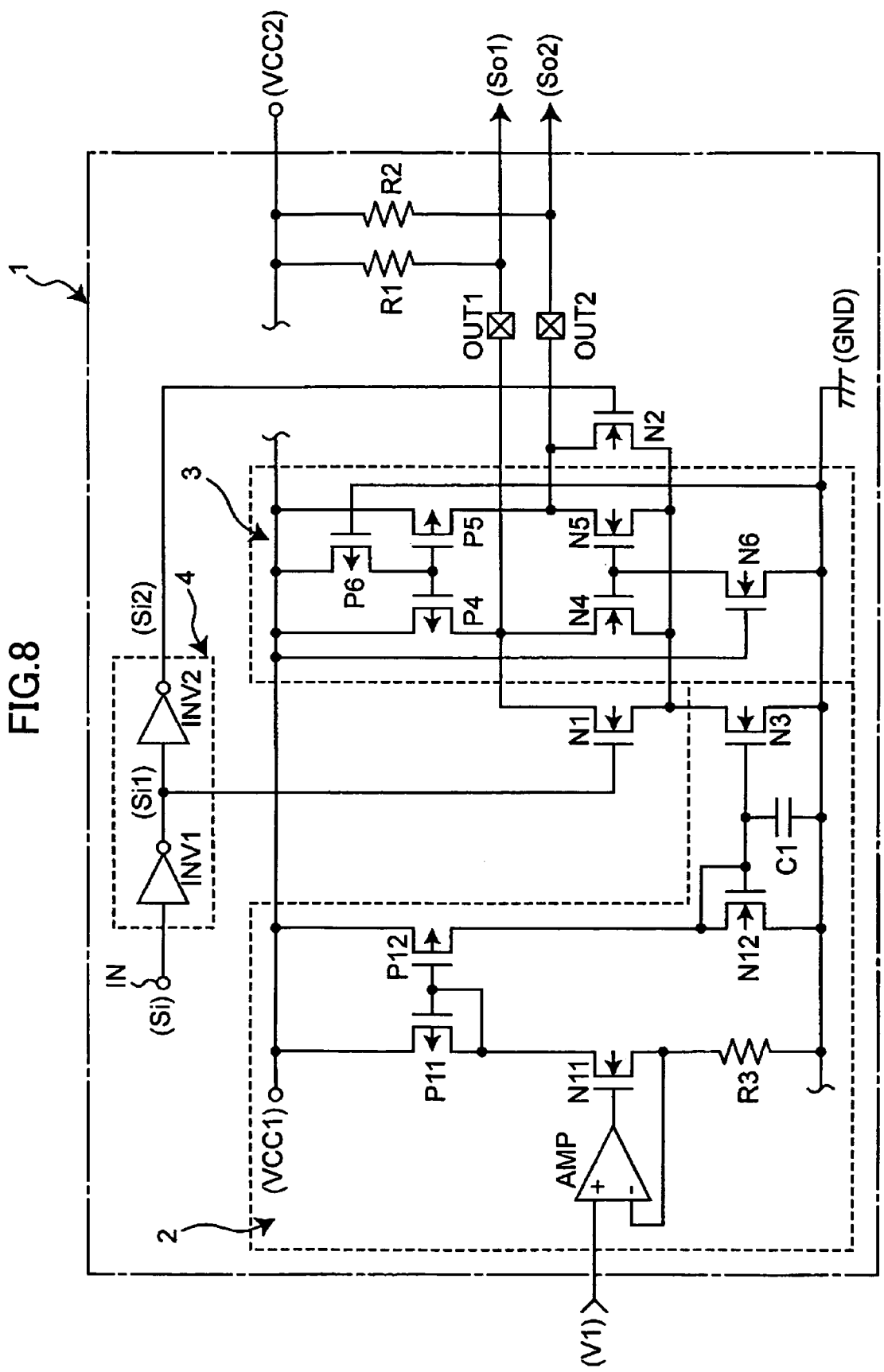
FIG. 8 is a circuit diagram showing a structure of a first embodiment of a differential output circuit according to the present invention.

FIG. 8 is a circuit diagram showing a structure of a first embodiment of a differential output circuit according to the present invention. FIG. 8 shows a case where CML circuit is used.

In FIG. 8, a differential output circuit 1 generates a pair of differential output signals So1 and So2 having mutually inverted logic signal levels (or complementary logic signal levels) from an input logic signal Si that is input to an input terminal IN, and outputs the differential output signals So1 and So2 from corresponding first and second output terminals OUT1 and OUT2.

The differential output circuit 1 includes NMOS transistors N1 and N2, resistors R1 and R2 respectively forming loads of the corresponding NMOS transistors N1 and N2, a constant current circuit 2 for supplying a predetermined constant current to the NMOS transistors N1 and N2, a protection circuit 3 for protecting the circuit from electrostatic, surge and the like, and an input control circuit 4 for generating signals Si1 and Si2 having mutually inverted logic signal levels from the input logic circuit Si.

The constant current circuit 2 includes an operational amplifier AMP, NMOS transistors N3, N11 and N12, PMOS transistors P11 and P12, a resistor R3 and a capacitor C1. The PMOS transistors P11 and P12 form a current mirror circuit, and the NMOS transistors N3 and N12 form a current mirror circuit. The protection circuit 3 includes NMOS transistors N4 through N6, and PMOS transistors P4 through P6. The input control circuit 4 includes inverters INV1 and INV2. In the case shown in FIG. 8, the NMOS transistors N1 and N2, the constant current circuit 2, the protection circuit 3 and the input control circuit 4 are integrated within a single IC.

The NMOS transistor N1 forms a first transistor, the NMOS transistor N2 forms a second transistor, the NMOS transistor N4 forms a fifth transistor, the NMOS transistor N5 forms a sixth transistor, and the NMOS transistor N6 forms a seventh transistor. On the other hand, the PMOS transistor P4 forms a eighth transistor, the PMOS transistor P5 forms a ninth transistor, the PMOS transistor P6 forms a tenth transistor, the NMOS transistor N3 forms an eleventh transistor, and the NMOS transistor N12 forms a twelfth transistor.

The PMOS transistor P11, the NMOS transistor N11 and the resistor R3 are connected in series between the second power supply voltage VCC1 that forms a predetermined first positive power supply voltage and the first power supply voltage GND that forms a predetermined negative power supply voltage. The gate of the PMOS transistor P11 is connected to the drain of the PMOS transistor P11. In FIG. 8, the first power supply voltage GND, that forms the predetermined negative power supply voltage, is the ground voltage. The gate of the NMOS transistor N11 is connected to the output terminal of the operational amplifier AMP, and a predetermined reference voltage V1 is input to an non-inverting input terminal of the operational amplifier AMP. A node connecting the NMOS transistor N11 and the resistor R3 is connected to an inverting input terminal of the operational amplifier AMP.

The PMOS transistor P12 and the NMOS transistor N12 are connected in series between the second power supply voltage VCC1 and the first power supply voltage GND. The gate of the PMOS transistor P12 is connected to the gate of the PMOS transistor P11. The gate of the NMOS transistor N12 is connected to the drain of the NMOS transistor N12. The capacitor C1 is connected between the gate of the NMOS transistor N12 and the first power supply voltage GND. In addition, the gate of the NMOS transistor N12 is connected to the gate of the NMOS transistor N3. The source of the NMOS transistor N3 is connected to the first power supply voltage GND. The NMOS transistors N1 and N4 are connected in parallel between the first output terminal OUT1 and the drain of the NMOS transistor N3. The NMOS transistors N2 and N5 are connected in parallel between the second output terminal OUT2 and the drain of the NMOS transistor N3.

A node connects the gates of the NMOS transistors N4 and N5, and the NMOS transistor N6 is connected between this node and the first power supply voltage GND. The gate of the NMOS transistor N6 is connected to the second power supply voltage VCC1. The PMOS transistor P4 is connected between the second power supply voltage VCC1 and the first output terminal OUT1, and the PMOS transistor P5 is connected between the second power supply voltage VCC1 and the second output terminal OUT2. A node connects the gates of the PMOS transistors P4 and P5, and the PMOS transistor P6 is connected between this node and the second power supply voltage VCC1. The gate of the PMOS transistor P6 is connected to the first power supply voltage GND. The inverters INV1 and INV2 are connected in series between the input terminal IN and the gate of the NMOS transistor N2. A node connecting the inverters INV1 and INV2 is connected to the gate of the NMOS transistor N1. The resistor R1 is connected between the first output terminal OUT1 and the third power supply voltage VCC2 that forms a predetermined second positive power supply voltage, and the resistor R2 is connected between the second output terminal OUT2 and the third power supply voltage VCC2.

The NMOS transistors N1 and N2 forming the differential pair operate in response to the reverse signal Si1 and the forward signal Si2 from the input control circuit 4. The amplitude of the differential output signals that are output via the first and second output terminals OUT1 and OUT2 is determined by the currents flowing through the resistors R1 and R2 and the resistances of the resistors R1 and R2. In FIG. 8, the resistors R1 and R2 are externally connected with respect to the corresponding first and second output terminals OUT1 and OUT2, but if necessary, the resistors R1 and R2 may be provided within the IC in which the first and second output terminals OUT1 and OUT2 are provided. In addition, the second power supply voltage VCC1 and the third power supply voltage VCC2 may be set to the same voltage. Moreover, the polarity (or P and N types) of each of the MOS transistors may be changed, so that the first power supply voltage is a predetermined positive power supply voltage, and the second and third power supply voltages are predetermined negative power supply voltages. In this case, the second and third power supply voltages that are the predetermined negative power supply voltages are the same voltage.

The NMOS transistors N4 and N5 do not operate when the differential output circuit 1 carries out a normal operation, and operates only in an abnormal state such as when the electrostatic enters the differential output circuit 1. Hence, the gates of the NMOS transistors N4 and N5 may be connected to the first power supply voltage GND, but in FIG. 8, the NMOS transistor N6 is turned ON during the normal operation so that the gate voltages of the NMOS transistors N4 and N5 become near the first power supply voltage GND. By taking this measure, when the electrostatic enters between the first output terminal OUT1 and the first power supply voltage GND and/or between the second output terminal OUT2 and the first power supply voltage GND, the gate voltages of the NMOS transistors N4 and N5 approach the source voltages with a delay than the sources of the NMOS transistors N4 and N5 due to the ON-resistance of the NMOS transistor N6. For this reason, the NMOS transistor N4 and/or the NMOS transistor N5 may turn ON when the electrostatic enters the differential output circuit 1.

Since the NMOS transistor N3 may turn ON when the electrostatic enters the differential output circuit 1, a current path may be formed by the NMOS transistor N4 and/or the NMOS transistor N5 when the electrostatic enters between the first output terminal OUT1 and the first power supply voltage GND and/or between the second output terminal OUT2 and the first power supply voltage GND. Hence, it is possible to reduce the possibility of being affected by noise caused by the electrostatic and the like compared to the case where the gates of the NMOS transistors N4 and N5 are connected to the first power supply voltage GND. When the NMOS transistor N6 turns OFF during the normal operation due to the delay of the rise time, fall time and the like of the power supply, the gates of the NMOS transistors N4 and N5 assume a high-impedance state. If the forming of the current path by the NMOS transistor N4 and/or the NMOS transistor N5 is undesirable, a resistor may be provided between the first power supply voltage GND and the gates of the NMOS transistors N4 and N5 in place of providing the NMOS transistor N6.

Similarly, the PMOS transistors P4 and P5 do not operate when the differential output circuit 1 carries out the normal operation, and operates only in the abnormal state such as when the electrostatic enters the differential output circuit 1. Hence, the gates of the PMOS transistors P4 and P5 may be connected to the second power supply voltage VCC1, but in FIG. 8, the PMOS transistor P6 is turned ON during the normal operation so that the gate voltages of the PMOS transistors P4 and P5 become near the second power supply voltage VCC1. By taking this measure, when the electrostatic enters between the first output terminal OUT1 and the second power supply voltage VCC1 and/or between the second output terminal OUT2 and the second power supply voltage VCC1, the gate voltages of the PMOS transistors P4 and P5 approach the source voltages with a delay than the sources of the PMOS transistors P4 and P5 due to the ON-resistance of the PMOS transistor P6. For this reason, the PMOS transistor P4 and/or the PMOS transistor P5 may turn ON when the electrostatic enters the differential output circuit 1.

A current path may be formed by the PMOS transistor P4 and/or the PMOS transistor P5 when the electrostatic enters between the first output terminal OUT1 and the second power supply voltage VCC1 and/or between the second output terminal OUT2 and the second power supply voltage VCC1. Hence, it is possible to reduce the possibility of being affected by noise caused by the electrostatic and the like compared to the case where the gates of the PMOS transistors P4 and P5 are connected to the second power supply voltage VCC1. When the PMOS transistor P6 turns OFF during the normal operation due to the delay of the rise time, fall time and the like of the power supply, the gates of the PMOS transistors P4 and P5 assume a high-impedance state. If the forming of the current path by the PMOS transistor P4 and/or the PMOS transistor P5 is undesirable, a resistor may be provided between the second power supply voltage VCC1 and the gates of the PMOS transistors P4 and P5 in place of providing the PMOS transistor P6.

When the electrostatic, surge and the like enter between the first output terminal OUT1 and the second power supply voltage VCC1, the electrostatic, surge and the like flow from the first output terminal OUT1 to the second power supply voltage VCC1 via the PMOS transistor P4. Thus, it is possible to protect the NMOS transistor N1 that is connected to the first output terminal OUT1 from the electrostatic, surge and the like. Similarly, when the electrostatic, surge and the like enter between the second output terminal OUT2 and the second power supply voltage VCC1, the electrostatic, surge and the like flow from the second output terminal OUT2 to the second power supply voltage VCC1 via the PMOS transistor P5. Hence, it is possible to protect the NMOS transistor N2 that is connected to the second output terminal OUT2 from the electrostatic, surge and the like.

In addition, when the electrostatic, surge and the like enter between the first output terminal OUT1 and the first power supply voltage GND, the electrostatic, surge and the like flow from the first output terminal OUT1 to the first power supply voltage GND via the parallel circuit, that is made up of the NMOS transistors N1 and N4, and the NMOS transistor N3. Hence, the electrostatic, surge and the like flowing to the NMOS transistor N1 can be reduced, and the NMOS transistor N1 that is connected to the first output terminal OUT1 can be protected from the electrostatic, surge and the like. When the NMOS transistor N1 is turned OFF, the electrostatic, surge and the like entering between the first output terminal OUT1 and the first power supply voltage GND flow from the first output terminal OUT1 to the first power supply voltage GND via the NMOS transistors N4 and N3, and the NMOS transistor N1 that is connected to the first output terminal OUT1 can be protected from the electrostatic, surge and the like.

Similarly, when the electrostatic, surge and the like enter between the second output terminal OUT2 and the first power supply voltage GND, the electrostatic, surge and the like flow from the second output terminal OUT2 to the first power supply voltage GND via the parallel circuit, that is made up of the NMOS transistors N2 and N5, and the NMOS transistor N3. Hence, the electrostatic, surge and the like flowing to the NMOS transistor N2 can be reduced, and the NMOS transistor N2 that is connected to the second output terminal OUT2 can be protected from the electrostatic, surge and the like. When the NMOS transistor N2 is turned OFF, the electrostatic, surge and the like entering between the second output terminal OUT2 and the first power supply voltage GND flow from the second output terminal OUT2 to the first power supply voltage GND via the NMOS transistors N5 and N3, and the NMOS transistor N2 that is connected to the second output terminal OUT2 can be protected from the electrostatic, surge and the like.

Because it is unnecessary to provide input/output cells with respect to the first and second output terminals OUT1 and OUT2 of the differential output circuit 1, it is possible to reduce the circuit area of the differential output circuit 1 and eliminate the need to develop the input/output cells for the differential output circuit 1. In addition, since the NMOS transistors N1 through N5 and the PMOS transistors P4 and P5 provide a path for passing the electrostatic, surge and the like when the electrostatic, surge and the like enter the differential output circuit 1, it is possible to prevent the operation speed of the differential output circuit 1 from deterioration which would otherwise occur if the input/output cells were provided due to the effects of the input/output cells and/or the effects of the parasitic elements within the input/output cells. Moreover, since no input/output cells are connected to the first and second output terminals OUT1 and OUT2, it is possible to reduce the error in the waveform of the differential output from the first and second output terminals OUT1 and OUT2, which would otherwise occur due to inconsistencies, generated during the production process, of the internal cells and the parasitic elements in the vicinity of the internal cells, between the input/output cells if such input/output cells were connected to the first and second output terminals OUT1 and OUT2.

On the other hand, in the differential output circuit 1, only the NMOS transistors N1 through N5 and the PMOS transistors P4 and P5 may be formed by the transistors having the thick oxide layer such as those used in the input/output cells, and the other transistors may be formed by the silicide transistors having the reduced parasitic resistance in the periphery thereof and suited for the high integration density, so as to protect the differential output circuit 1 from the electrostatic, surge and the like. In addition, it is possible to prevent damage or deterioration to the NMOS transistor N3 which may occur when the current is concentrated due to the electrostatic, surge and the like entering the differential output circuit 1. By not using the silicide transistor and instead using the transistor having the thick oxide layer for the NMOS transistor N12, a current mirror circuit is formed together with the NMOS transistor N3 using the same kind of transistor. As a result, it is possible to improve the accuracy of the predetermined constant current, and to prevent the deterioration or damage to the NMOS transistor N3 which may occur when the current is concentrated due to the electrostatic, surge and the like entering the differential output circuit 1.

Figure 9:
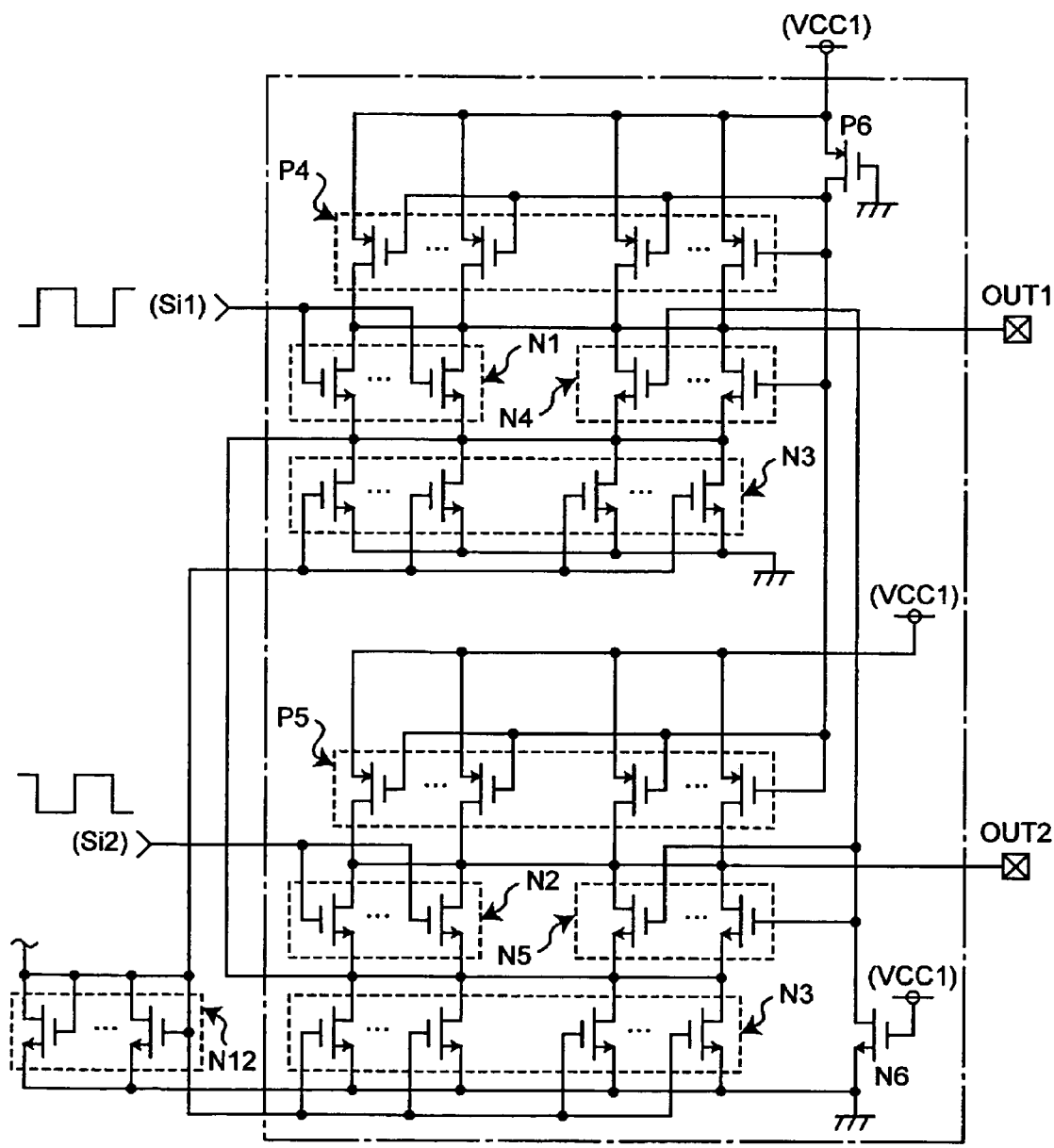
FIG. 9 is a circuit diagram showing a layout of NMOS transistors N1 through N6 and N12 and PMOS transistors P4 through P6 shown in FIG. 8.

FIG. 9 is a circuit diagram showing a layout of the NMOS transistors N1 through N6 and N12 and the PMOS transistors P4 through P6 shown in FIG. 8.

As may be seen from FIG. 9, each of the NMOS transistors N1 through N6 and N12 and the PMOS transistors P4 through P6 is formed by a plurality of transistors that are arranged in parallel. The PMOS transistor P4 is formed by a number of PMOS transistors which is a sum of the number of transistors forming the NMOS transistor N1 and the number of transistors forming the NMOS transistor N4. The PMOS transistor P5 is formed by a number of PMOS transistors which is a sum of the number of transistors forming the NMOS transistor N2 and the number of transistors forming the NMOS transistor N5. The NMOS transistor N3 is formed by a number of NMOS transistors that is a sum total of the number of transistors forming each of the NMOS transistors N1, N2, N4 and N5. The NMOS transistors N1 through N6 and N12 and the PMOS transistors P4 through P6 are formed by the plurality of transistors as shown in FIG. 9, because the NMOS transistors N1 through N5 and the PMOS transistors P4 and P5 provide a path for passing the electrostatic, surge and the like from the first and second output terminals OUT1 and OUT2 to the first power supply voltage GND and the second power supply voltage VCC1.

The NMOS transistors N1 through N3 in the differential output circuit 1 must normally have a transistor size that enables a current on the order of several mA to flow. The NMOS transistors N1 through N5 and the PMOS transistors P4 and P5, which provide the path for the electrostatic, surge and the like to pass, have a structure that facilitates distribution of the current so that a large current will not be concentrated at a portion of the transistors arranged in parallel. In addition, since the NMOS transistors N1, N2, N4 and N5 and the PMOS transistors P4 and P5 are connected to either one of the first and second output terminals OUT1 and OUT2 and the electrostatic, surge and the like are directly input thereto, the drain area of each of the NMOS transistors N1, N2, N4 and N5 and the PMOS transistors P4 and P5 is set large. Furthermore, the drain area of the NMOS transistor N3 is similarly set large.

Figure 10:
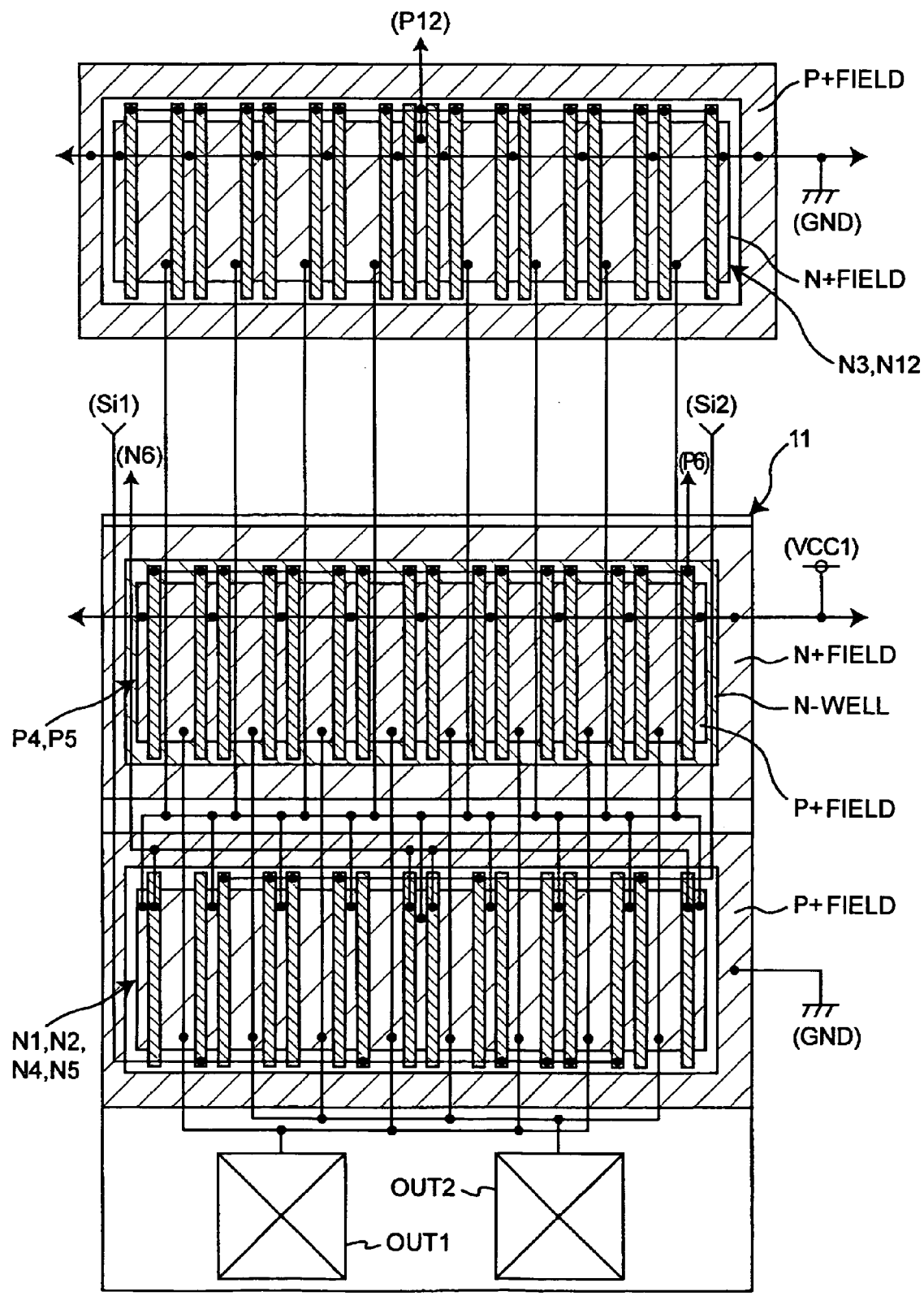
FIG. 10 is a diagram showing an example of a particular layout of the circuit shown in FIG. 9.

FIG. 10 is a diagram showing an example of a particular layout of the circuit shown in FIG. 9.

In FIG. 10, the transistors forming the NMOS transistors N1, N2, N4 and N5 are made of the same polarity (that is, the same N type), same size and same kind. These transistors are formed in parallel, but with the arranging order rearranged so that the transistors form pairs. As a result, the matching accuracy of the transistors is improved, and in addition, the matching accuracy of the parasitic elements in the periphery of the first and second output terminals OUT1 and OUT2 is improved, with respect to inconsistencies introduced during the production process. Therefore, it is possible to obtain from the first and second output terminals OUT1 and OUT2 a differential output having a waveform with a high quality and reduced error.

In addition, since the NMOS transistors N1, N2, N4 and N5 provide the path for passing the electrostatic, surge and the like, and these NMOS transistors N1, N2, N4 and N5 are made up of the transistors having the same shape and the same size in the layout, it is possible to uniformly distribute the electrostatic, surge and the like.

The transistor size may be determined as follows. That is, a reference transistor size, which satisfies the condition to prevent deterioration or damage caused by the electrostatic, surge and the like, is set. Then, the transistor size of the NMOS transistors N1 and N2 is determined with reference to the reference transistor size, by taking into consideration the transistor size that can tolerate the current during the operation and the magnitude of the switching noise. Thereafter, the transistor size of the NMOS transistors N4 and N5 may be determined so that these NMOS transistors N4 and N5 fit within the remaining region (or area) that is available.

Similarly, the transistors forming the NMOS transistor N3 may be arranged in parallel and have the same shape in the layout as the transistors forming the NMOS transistors N1, N2, N4 and N5, so that the current caused by the electrostatic, surge and the like is uniformly distributed with respect to the first power supply voltage GND. Moreover, because the NMOS transistors N3 and N12 form a current mirror circuit, the NMOS transistors N3 and N12 are arranged by considering the two as forming a pair, so that the current flowing to the NMOS transistor N3 has a current value approximating the transistor size ratio of the NMOS transistor N3 with respect to the NMOS transistor N12.

The transistors forming the PMOS transistors P4 and P5 are made of the same polarity (that is, the same P type), same size and same kind. These transistors are formed in parallel, but with the arranging order rearranged so that the transistors form pairs. As a result, the matching accuracy of the transistors is improved, and in addition, the matching accuracy of the parasitic elements in the periphery of the first and second output terminals OUT1 and OUT2 is improved, with respect to inconsistencies introduced during the production process. Therefore, it is possible to obtain from the first and second output terminals OUT1 and OUT2 a differential output having a waveform with a high quality and reduced error.

The PMOS transistors P4 and P5 do not operate during operation of the differential output circuit 1. When the electrostatic, surge and the like enter the differential output circuit 1, the PMOS transistors P4 and P5 provide a path for passing the electrostatic, surge and the like. Since the PMOS transistors P4 and P5 are formed by the transistors having the same shape and the same size in the layout, it is possible to uniformly distribute the electrostatic, surge and the like. In addition, the transistor size of the PMOS transistors P4 and P5 may be determined with reference to a reference transistor size, which satisfies the condition to prevent deterioration or damage caused by the electrostatic, surge and the like.

The periphery of the NMOS transistors N1, N2, N4 and N5 is surrounded by a P+ field having the polarity opposite to that of each of these transistors. The periphery of the PMOS transistors P4 and P5 is surrounded by an N+ field having a polarity opposite to that of each of these transistors. Each of the P+ and N+ fields are provided to realize a diode function when the electrostatic, surge and the like enter the differential output circuit 1, and each of the P+ and N+ fields surrounds the transistors at equal distances from the field within each transistor. The NMOS transistors N1, N2, N4 and N5 and the PMOS transistors P4 and P5 are formed by transistors having a thick oxide layer that are generally used as protection transistors for preventing damage caused by electrostatic discharge or surge within input/output cells, unlike the other transistors within the differential output circuit 1 that are formed by the silicide transistors having a thin oxide layer and reduced parasitic resistance in the periphery of the transistor. Consequently, when the electrostatic, surge and the like enter the differential output circuit 1, the electrostatic, surge and the like are easily distributed to the peripheral diffusion region (field) surrounding the transistors and having the polarity opposite to that of the transistors.

In FIG. 10, the NMOS transistors N1, N2, N4 and N5, the PMOS transistors P4 and P5, a pad forming the first output terminal OUT1 and a pad forming the second output terminal OUT2 form the shape of a single input/output cell in the layout. For this reason, it is possible to improve the area utilization efficiency of the semiconductor chip, by providing an input/output cell-shaped part 11, which is made up of the NMOS transistors N1, N2, N4 and N5, the PMOS transistors P4 and P5, and the pads forming the first and second output terminals OUT1 and OUT2, in an input/output cell region of the integrated circuit. In addition, the distances between the pads forming the first and second output terminals OUT1 and OUT2 and the NMOS transistors N1 and N2 forming the differential pair within the differential output circuit 1 can be made short. Hence, it is possible to make the wiring resistance small, and simultaneously make the parasitic resistance due to the wiring resistance small, to thereby realize a high-speed operation of the differential output circuit 1.

In a general integrated circuit, the input/output cells are arranged so as to surround the periphery of the internal circuits of the integrated circuit in the layout. Wirings for the positive power supply voltage and the negative power supply voltage for the input/output cells are arranged to traverse the input/output cells in a manner surrounding the periphery of the internal circuits of the integrated circuits. For this reason, when the NMOS transistors N1, N2, N4 and N5, the PMOS transistors P4 and P5, and the pads forming the first and second output terminals OUT1 and OUT2 are arranged in the input/output cell region in the layout with the input/output cell structure, it is possible to effectively utilize the wiring regions of the positive power supply voltage and the negative power supply voltage, to thereby improve the area utilization efficiency of the semiconductor chip or reduce the semiconductor chip area.

The NMOS transistor N6 is provided to fix the gate voltages of the NMOS transistors N4 and N5, and the PMOS transistor P6 is provided to fix the gate voltages of the PMOS transistors P4 and P5. Hence, although the NMOS transistor N6 and the PMOS transistor P6 shown in FIG. 9 are not illustrated in FIG. 10, the transistor size of the NMOS transistor N6 and the PMOS transistor P6 may be smaller than the transistor size of the NMOS transistors N1, N2, N4 and N5 and the PMOS transistors P4 and P5. Further, since the NMOS transistor N6 and the PMOS transistor P6 may be formed by the same kind of transistors as the internal circuit of the integrated circuit, the NMOS transistor N6 and the PMOS transistor P6 may be arranged within the input/output cell-shaped part 11 shown in FIG. 10 or within the internal circuit of the integrated circuit.

Figure 11:
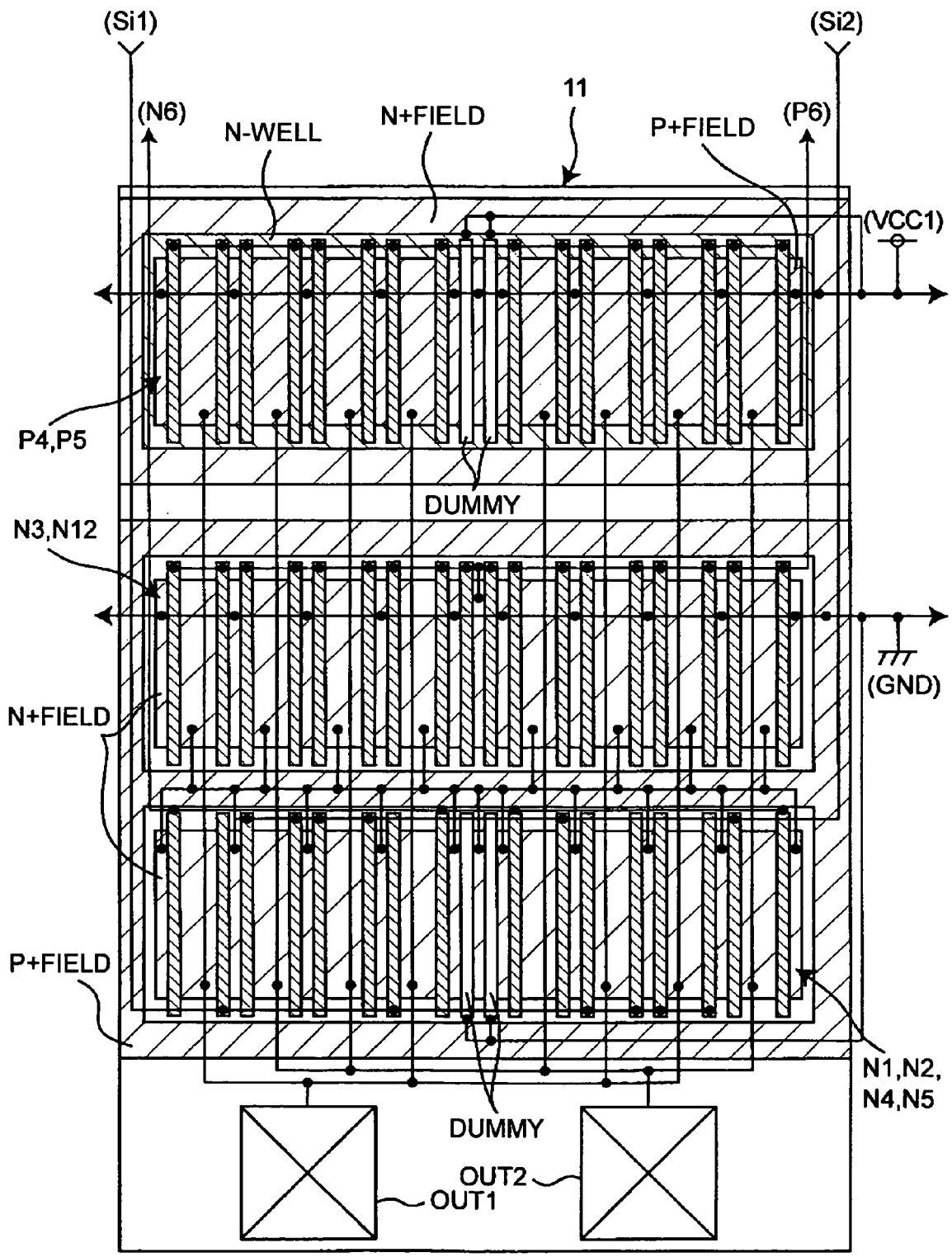
FIG. 11 is a diagram showing another example of the particular layout of the circuit shown in FIG. 9.

The NMOS transistors N3 and N12 forming the current mirror circuit may be included in the single input/output cell-shaped part 11 that is formed by the NMOS transistors N1, N2, N4 and N5, the PMOS transistors P4 and P5, and the pads forming the first and second output terminals OUT1 and OUT2. In this case, the layout shown in FIG. 10 becomes as shown in FIG. 11. FIG. 11 is a diagram showing another example of the particular layout of the circuit shown in FIG. 9.

By including the NMOS transistors N3 and N12 in the input/output cell-shaped part 11 shown in FIG. 10, it becomes possible to easily separate the input control circuit 4 and the constant current circuit 2 that is made up of the operational amplifier AMP, the NMOS transistors N3, N11 and N12, the PMOS transistors P11 and P12 and the resistor R3, in the differential output circuit 1 as shown in FIG. 11. In other words, it is possible to easily create a floor plan for the layout. Moreover, by including the NMOS transistors N3 and N12 in the input/output cell-shaped part 11 shown in FIG. 10, the wiring that becomes long due to the layout restrictions becomes the path for supplying the current from the PMOS transistor P12 to the NMOS transistor N11, even if a certain distance is required between the internal circuit and the input/output cell region in the integrated circuit. As a result, compared to a wiring having a high impedance such as the wiring to the gate of the transistor, it is unnecessary to take utmost care when treating the wiring (the path for supplying the current from the PMOS transistor P12 to the NMOS transistor N11) that becomes long due to the layout restrictions.

Therefore, when the differential output circuit 1 uses the CML circuit, the NMOS transistors N1 and N4 forming the differential pair are connected in parallel, and the NMOS transistors N2 and N5 forming the differential pair are connected in parallel. In addition, the gates of the NMOS transistors N4 and N5 are connected to the first power supply voltage GND via the NMOS transistor N6 having the gate thereof connected to the second power supply voltage VCC1. The PMOS transistor P4 is connected between the second power supply voltage VCC1 and the first output terminal OUT1, and the PMOS transistor P5 is connected between the second power supply voltage VCC1 and the second output terminal OUT2. The gates of the PMOS transistors P4 and P5 are connected to the second power supply voltage VCC1 via the PMOS transistor P6 having the gate thereof connected to the first power supply voltage GND. Hence, it is possible to prevent inconveniences caused by the electrostatic, surge and the like, improve the quality of the differential output signals and the high-speed operation of the differential output circuit 1, and reduce the semiconductor chip area.

Figure 1:
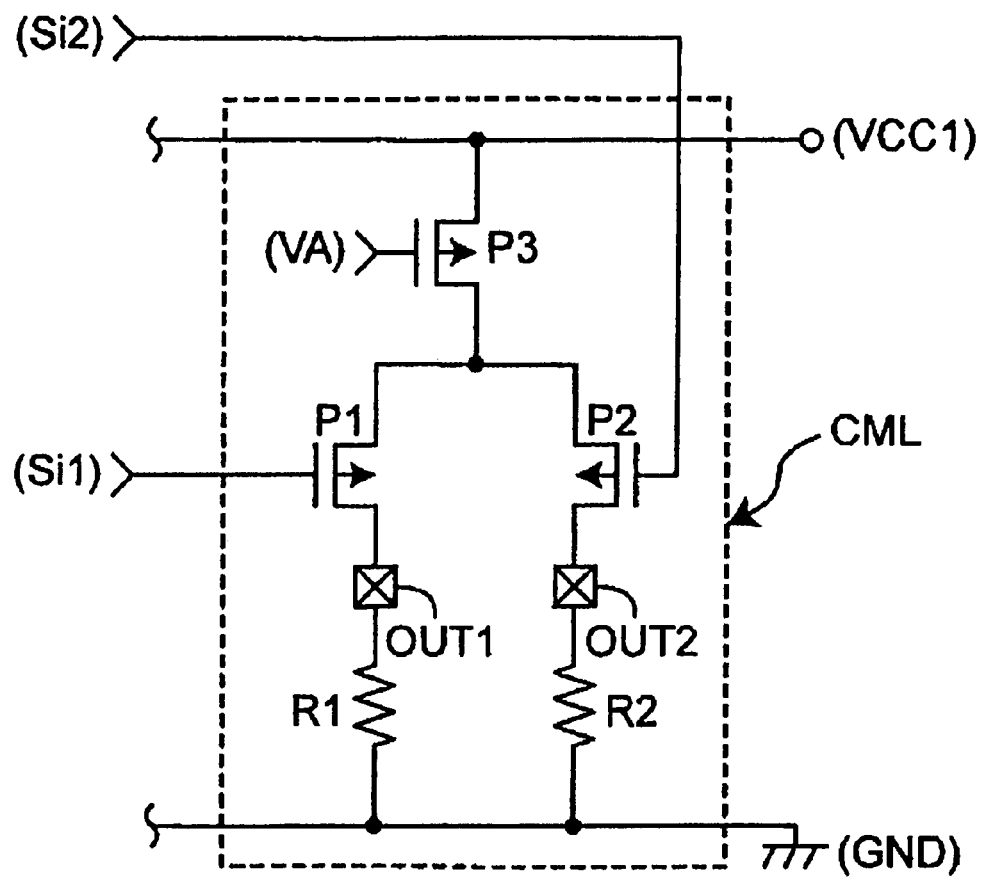
FIG. 1 is a circuit diagram showing an example of a conventional CML circuit.
Figure 2:
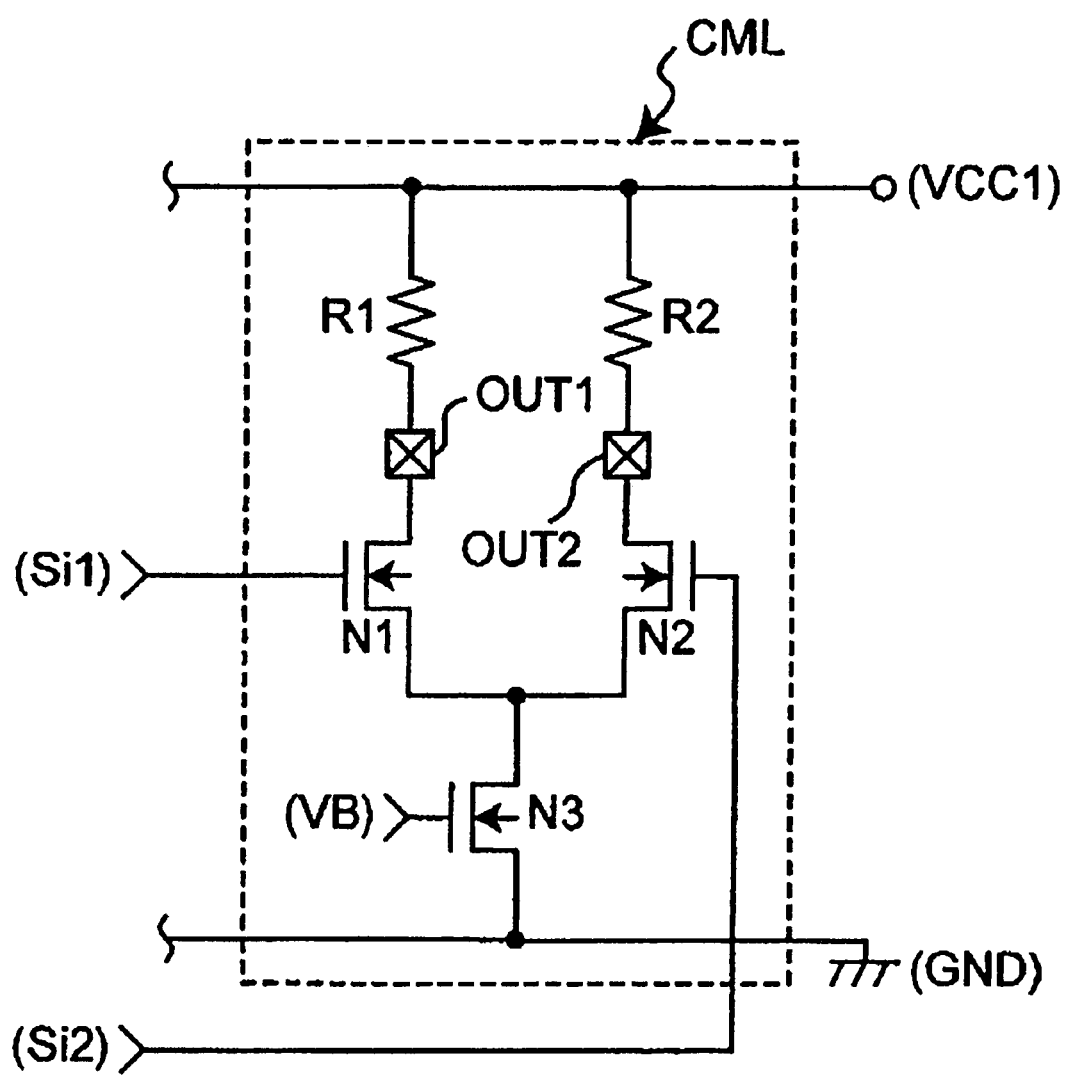
FIG. 2 is a circuit diagram showing another example of the conventional CML circuit.
Figure 3:
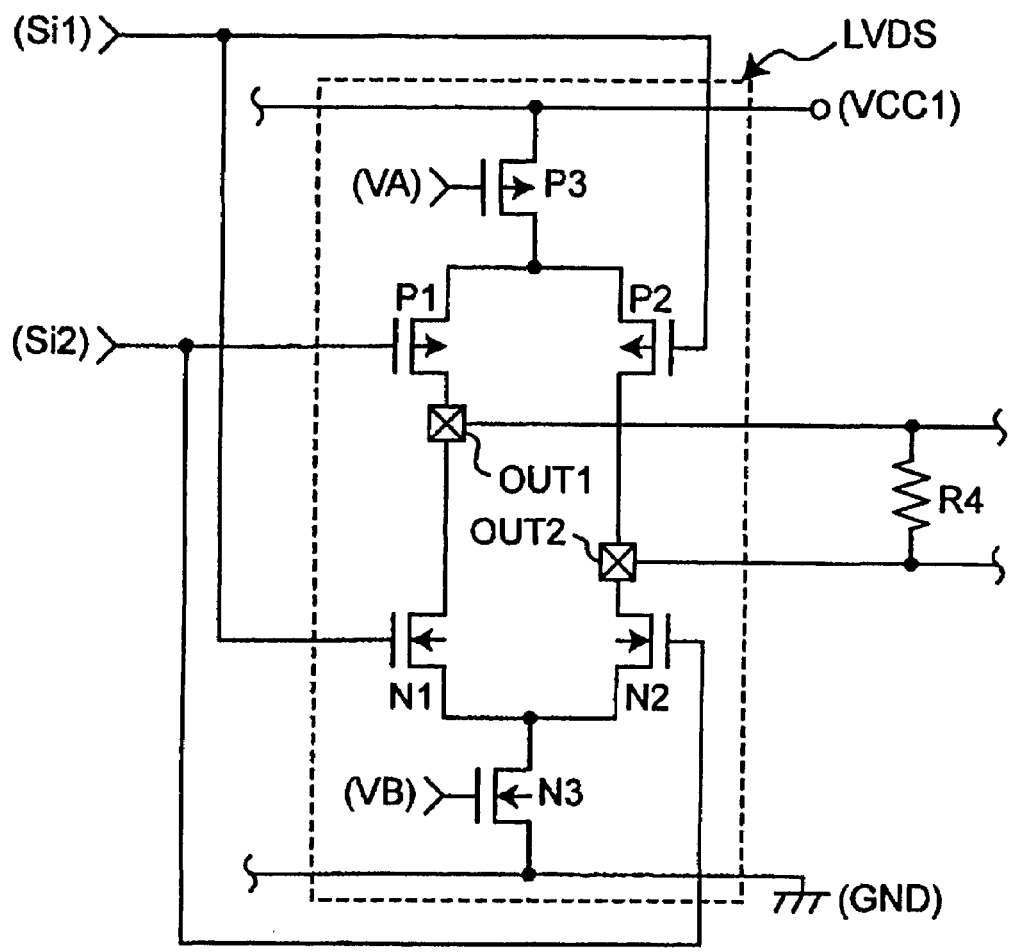
FIG. 3 is a circuit diagram showing an example of a conventional LVDS circuit.
Figure 4:
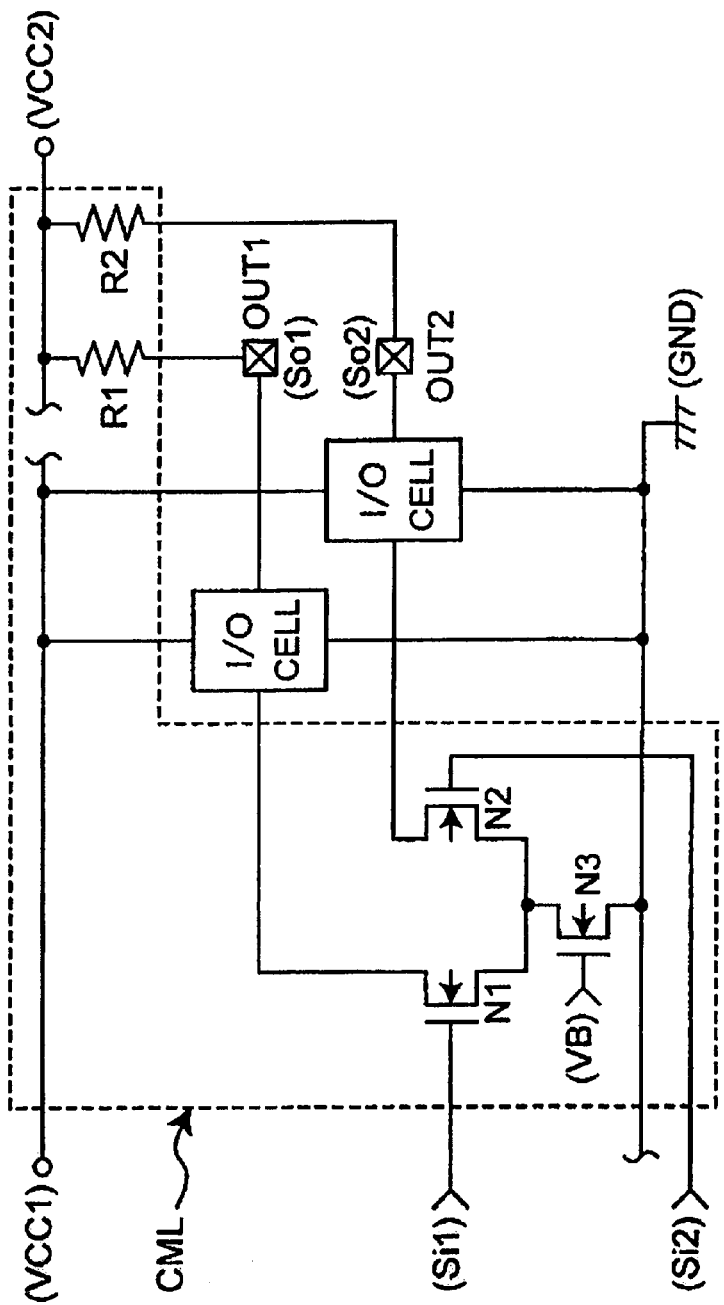
FIG. 4 is a circuit diagram showing an example where input/output cells are connected to the CML circuit shown in FIG. 2.
Figure 5:
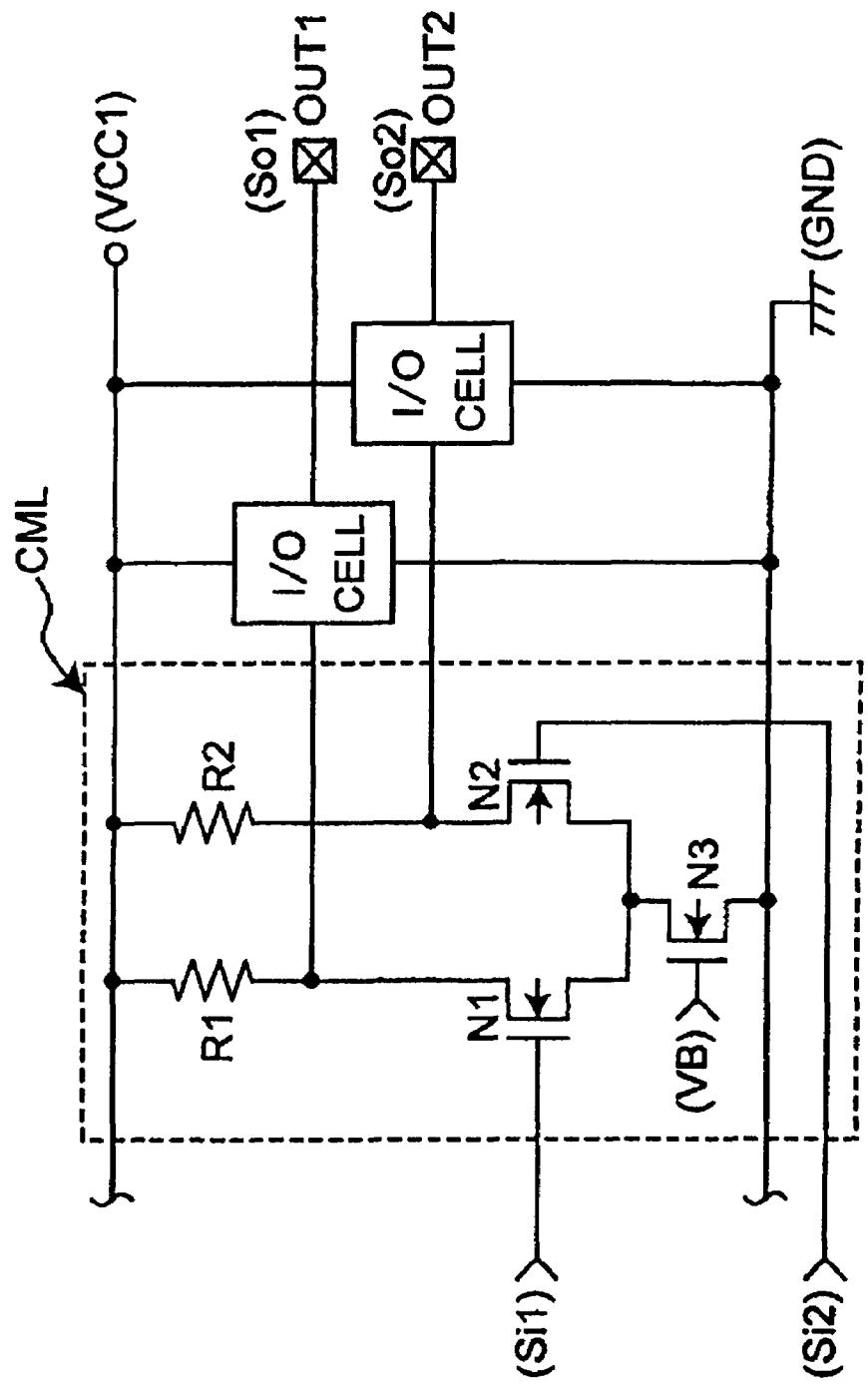
FIG. 5 is a circuit diagram showing another example where input/output cells are connected to the CML circuit shown in FIG. 2.
Figure 6:
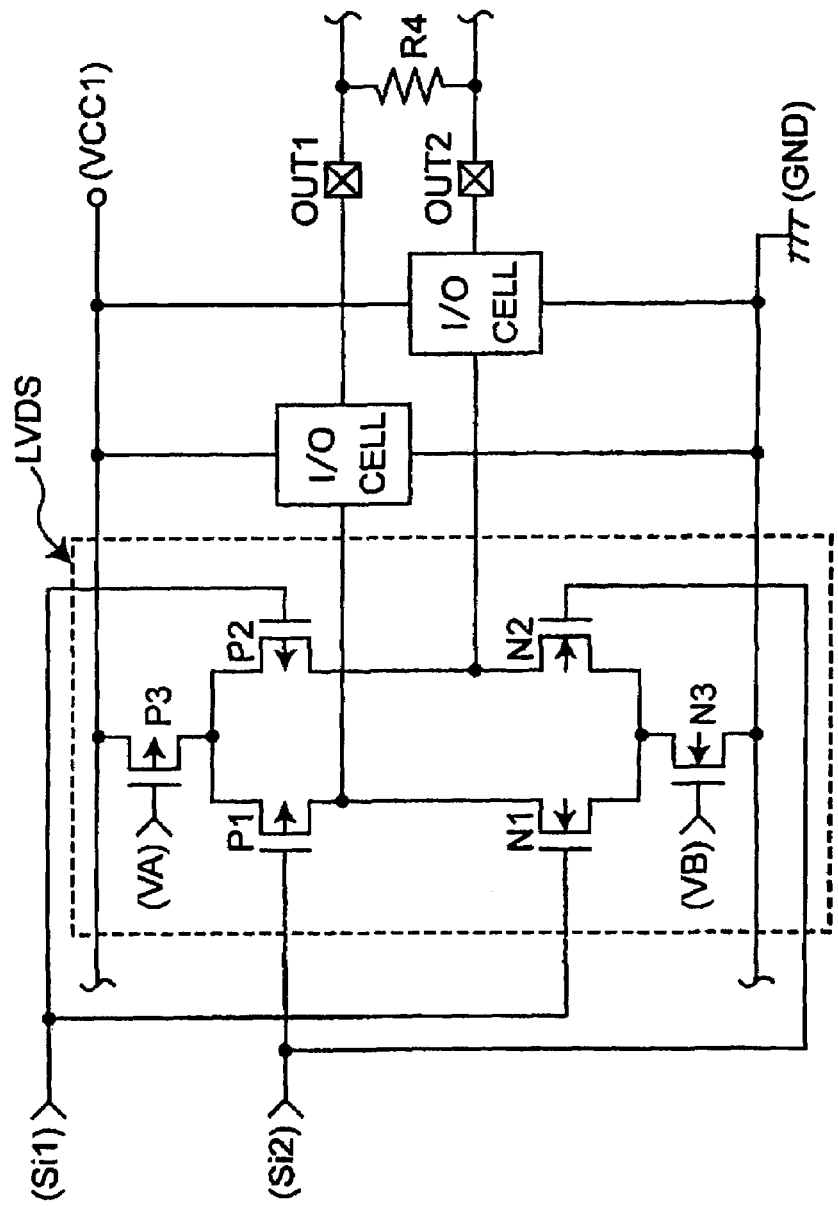
FIG. 6 is a circuit diagram showing an example where input/output cells are connected to the LVDS circuit shown in FIG. 3.
Figure 7:
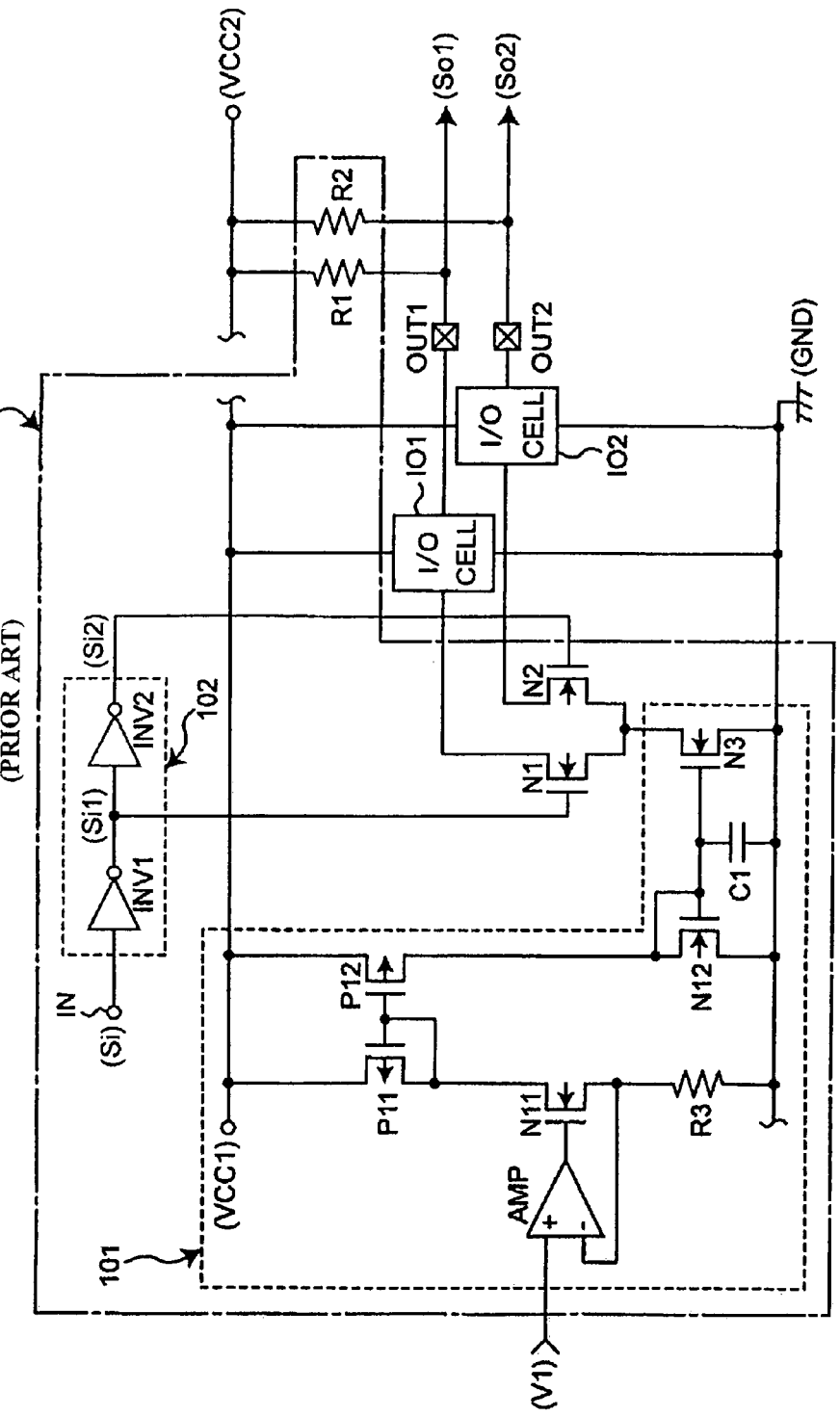
FIG. 7 is a circuit diagram showing an example of a conventional low-amplitude differential output circuit.
Figure 12:
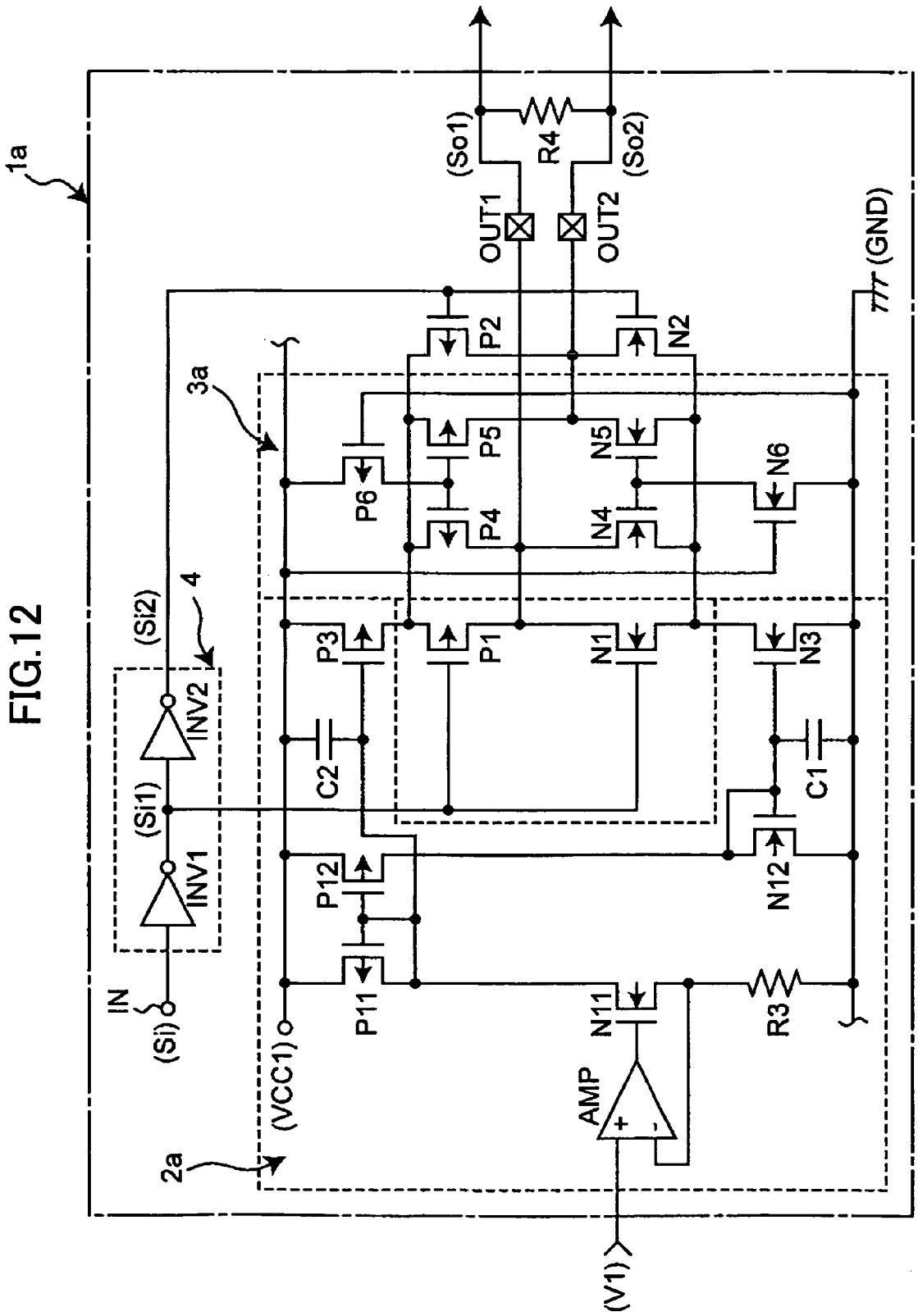
FIG. 12 is a circuit diagram showing another structure of the first embodiment of the differential output circuit according to the present invention.

The differential output circuit 1 shown in FIG. 6 uses the CML circuit, but when an LVDS circuit is used, a differential output circuit 1a becomes as shown in FIG. 12. FIG. 12 is a circuit diagram showing another structure of the first embodiment of the differential output circuit according to the present invention. In FIG. 12, those parts which are the same as those corresponding parts in FIG. 8 are designated by the same reference numerals, and a description thereof will be omitted.

The differential output circuit 1a shown in FIG. 12 differs from the differential output circuit 1 shown in FIG. 8, in that PMOS transistors P1 through P3 are additionally provided in a protection circuit 3a compared to the protection circuit 3 shown in FIG. 8, and the sources of the PMOS transistors P4 and P5 are connected to the second power supply voltage VCC1 via the PMOS transistor P3. Hence, a constant current circuit 2a having the structure shown in FIG. 12 is connected to the protection circuit 3a. Furthermore, FIG. 12 shows a case where the first power supply voltage GND is the predetermined negative power supply voltage, that is, the ground voltage.

In FIG. 12, the differential output circuit 1a generates a pair of differential output signals So1 and So2 having mutually inverted logic signal levels from an input logic signal Si that is input to an input terminal IN, and outputs the differential output signals So1 and So2 from corresponding output terminals OUT1 and OUT2.

The differential output circuit 1a includes the NMOS transistors N1 and N2 forming a differential pair, the PMOS transistors P1 and P2 forming a differential pair, the constant current circuit 2a for supplying a predetermined constant current to the NMOS transistor N1 and N2 and to the PMOS transistors P1 and P2, the protection circuit 3a for protecting the differential output circuit 1a from the electrostatic, surge and the like, and the input control circuit 4.

The constant current circuit 2a includes the operational amplifier AMP, the NMOS transistors N3, N11 and N12, the PMOS transistors P3, P11 and P12, the resistor R3, and capacitors C1 and C2. The NMOS transistors N3 and N12 form a first current mirror circuit, and the PMOS transistors P3, P11 and P12 form a second current mirror circuit.

The protection circuit 3a includes the NMOS transistors N4 through N6 and the PMOS transistors P4 through P6. In the case shown in FIG. 12, the NMOS transistors N1 and N2, the PMOS transistors P1 and P2, the constant current circuit 2a, the protection circuit 3a and the input control circuit 4 are integrated within a single IC. The PMOS transistor Pa forms a third transistor, the PMOS transistor P2 forms a fourth transistor, the PMOS transistor P3 forms a thirteenth transistor, the PMOS transistor P11 forms a fourteenth transistor, and the PMOS transistor P12 forms a fifteenth transistor.

The gate of the PMOS transistor P3 is connected to a node that connects the gates of the PMOS transistors P11 and P12, and the capacitor C2 is connected between this node and the second power supply voltage VCC1. The source of the PMOS transistor P3 is connected to the second power supply voltage VCC1. The PMOS transistors P1 and P4 are connected in parallel between the drain of the PMOS transistor P3 and the first output terminal OUT1, and the PMOS transistors P2 and P5 are connected in parallel between the drain of the PMOS transistor P3 and the second output terminal OUT2. A node connects the gates of the PMOS transistors P4 and P5, and the PMOS transistor P6 is connected between this node and the second power supply voltage VCC1. The gate of the PMOS transistor P6 is connected to the first power supply voltage GND. In addition, the signal Si1 from the input control circuit 4 is input to the gate of the PMOS transistor P1, and the signal Si2 from the input control circuit 4 is input to the gate of the PMOS transistor P2. A resistor R4 is connected between the first and second output terminals OUT1 and OUT2.

The NMOS transistors N1 and N2 which form a first differential pair operate in response to the reverse signal Si1 and the forward signal Si2 from the input control circuit 4. The PMOS transistors P1 and P2 which form a second differential pair operate in response to the reverse signal Si1 and the forward signal Si2 from the input control circuit 4. The currents flowing to the NMOS transistor N3 and the PMOS transistor P3 are set to be the same. The amplitudes of the differential output signals So1 and So2 are determined by the current flowing through the resistor R4 by the respective operations of the NMOS transistors N1 and N2 forming the first differential pair and the PMOS transistors P1 and P2 forming the second differential pair.

Normally, the currents flowing to the NMOS transistors N1 and N2 and the PMOS transistors P1 and P2 are set to be the same as the currents flowing to the NMOS transistor N3 and the PMOS transistor P3, and a current flows to the PMOS transistor P2 when a current flows to the NMOS transistor N1, and a current flows to the PMOS transistor P1 when a current flows to the NMOS transistor N2. The NMOS transistors N1 and N2 do not turn ON at the same time, and thus, currents will not flow simultaneously to the NMOS transistors N1 and N2. Similarly, the PMOS transistors P1 and P2 do not turn ON at the same time, and thus, currents will not flow simultaneously to the PMOS transistors P1 and P2.

The polarity (or P and N types) of each of the MOS transistors shown in FIG. 12 may be changed, so that the first power supply voltage is a predetermined positive power supply voltage, and the second power supply voltage is a predetermined negative power supply voltage. In FIG. 12, the gates of the NMOS transistor N1 and the PMOS transistor P1 are connected via a node, the gates of the NMOS transistor N2 and the PMOS transistor P2 are connected via a node, and the two nodes are connected to the input control circuit 4. However, the gates of the NMOS transistors N1 and N2 and the PMOS transistors P1 and P2 may be connected separately from the input control circuit 4. In addition, only one of the NMOS transistor N3 and the PMOS transistor P3 may form a current mirror circuit.

The NMOS transistors N4 and N5 do not operate when the differential output circuit 1a carries out a normal operation, and operates only in an abnormal state such as when the electrostatic enters the differential output circuit 1a. Hence, the gates of the NMOS transistors N4 and N5 may be connected to the first power supply voltage GND, but in FIG. 12, the NMOS transistor N6 is turned ON during the normal operation so that the gate voltages of the NMOS transistors N4 and N5 become near the first power supply voltage GND. By taking this measure, when the electrostatic enters between the first output terminal OUT1 and the first power supply voltage GND and/or between the second output terminal OUT2 and the first power supply voltage GND, the gate voltages of the NMOS transistors N4 and N5 approach the source voltages with a delay than the sources of the NMOS transistors N4 and N5 due to the ON-resistance of the NMOS transistor N6. For this reason, the NMOS transistor N4 and/or the NMOS transistor N5 may turn ON when the electrostatic enters the differential output circuit 1a.

Since the NMOS transistor N3 may turn ON when the electrostatic enters the differential output circuit 1a, a current path may be formed by the NMOS transistor N4 and/or the NMOS transistor N5 when the electrostatic enters between the first output terminal OUT1 and the first power supply voltage GND and/or between the second output terminal OUT2 and the first power supply voltage GND. Hence, it is possible to reduce the possibility of being affected by noise caused by the electrostatic and the like compared to the case where the gates of the NMOS transistors N4 and N5 are connected to the first power supply voltage GND. When the NMOS transistor N6 turns OFF during the normal operation due to the delay of the rise time, fall time and the like of the power supply, the gates of the NMOS transistors N4 and N5 assume a high-impedance state. If the forming of the current path by the NMOS transistor N4 and/or the NMOS transistor N5 is undesirable, a resistor may be provided between the first power supply voltage GND and the gates of the NMOS transistors N4 and N5 in place of providing the NMOS transistor N6.

Similarly, the PMOS transistors P4 and P5 do not operate when the differential output circuit 1a carries out the normal operation, and operates only in the abnormal state such as when the electrostatic enters the differential output circuit 1a. Hence, the gates of the PMOS transistors P4 and P5 may be connected to the second power supply voltage VCC1, but in FIG. 12, the PMOS transistor P6 is turned ON during the normal operation so that the gate voltages of the PMOS transistors P4 and P5 become near the second power supply voltage VCC1. By taking this measure, when the electrostatic enters between the first output terminal OUT1 and the second power supply voltage VCC1 and/or between the second output terminal OUT2 and the second power supply voltage VCC1, the gate voltages of the PMOS transistors P4 and P5 approach the source voltages with a delay than the sources of the PMOS transistors P4 and P5 due to the ON-resistance of the PMOS transistor P6. For this reason, the PMOS transistor P4 and/or the PMOS transistor P5 may turn ON when the electrostatic enters the differential output circuit 1a.

A current path may be formed by the PMOS transistor P4 and/or the PMOS transistor P5 when the electrostatic enters between the first output terminal OUT1 and the second power supply voltage VCC1 and/or between the second output terminal OUT2 and the second power supply voltage VCC1. Hence, it is possible to reduce the possibility of being affected by noise caused by the electrostatic and the like compared to the case where the gates of the PMOS transistors P4 and P5 are connected to the second power supply voltage VCC1. When the PMOS transistor P6 turns OFF during the normal operation due to the delay of the rise time, fall time and the like of the power supply, the gates of the PMOS transistors P4 and P5 assume a high-impedance state. If the forming of the current path by the PMOS transistor P4 and/or the PMOS transistor P5 is undesirable, a resistor may be provided between the second power supply voltage VCC1 and the gates of the PMOS transistors P4 and P5 in place of providing the PMOS transistor P6.

When the electrostatic, surge and the like enter between the first output terminal OUT1 and the second power supply voltage VCC1, the electrostatic, surge and the like flow from the first output terminal OUT1 to the second power supply voltage VCC1 via a parallel circuit, made up of the PMOS transistors P1 and P4, and the PMOS transistor P3. Thus, it is possible to protect the PMOS transistor P1 that is connected to the first output terminal OUT1 from the electrostatic, surge and the like. Similarly, when the electrostatic, surge and the like enter between the second output terminal OUT2 and the second power supply voltage VCC1, the electrostatic, surge and the like flow from the second output terminal OUT2 to the second power supply voltage VCC1 via a parallel circuit, made up of the PMOS transistors P2 and P5, and the PMOS transistor P3. Hence, it is possible to protect the PMOS transistor P2 that is connected to the second output terminal OUT2 from the electrostatic, surge and the like.

In addition, when the electrostatic, surge and the like enter between the first output terminal OUT1 and the first power supply voltage GND, the electrostatic, surge and the like flow from the first output terminal OUT1 to the first power supply voltage GND via the parallel circuit, that is made up of the NMOS transistors N1 and N4, and the NMOS transistor N3. Hence, the electrostatic, surge and the like flowing to the NMOS transistor N1 can be reduced, and the NMOS transistor N1 that is connected to the first output terminal OUT1 can be protected from the electrostatic, surge and the like. Similarly, when the electrostatic, surge and the like enter between the second output terminal OUT2 and the first power supply voltage GND, the electrostatic, surge and the like flow from the second output terminal OUT2 to the first power supply voltage GND via the parallel circuit, that is made up of the NMOS transistors N2 and N5, and the NMOS transistor N3. Hence, the electrostatic, surge and the like flowing to the NMOS transistor N2 can be reduced, and the NMOS transistor N2 that is connected to the second output terminal OUT2 can be protected from the electrostatic, surge and the like.

Because it is unnecessary to provide input/output cells with respect to the first and second output terminals OUT1 and OUT2 of the differential output circuit 1a, it is possible to reduce the circuit area of the differential output circuit 1a and eliminate the need to develop the input/output cells for the differential output circuit 1a. In addition, since the NMOS transistors N1 through N5 and the PMOS transistors P1 through P5 provide a path for passing the electrostatic, surge and the like when the electrostatic, surge and the like enter the differential output circuit 1a, it is possible to prevent the operation speed of the differential output circuit 1a from deterioration which would otherwise occur if the input/output cells were provided due to the effects of the input/output cells and/or the effects of the parasitic elements within the input/output cells. Moreover, since no input/output cells are connected to the first and second output terminals OUT1 and OUT2, it is possible to reduce the error in the waveform of the differential output from the first and second output terminals OUT1 and OUT2, which would otherwise occur due to inconsistencies, generated during the production process, of the internal cells and the parasitic elements in the vicinity of the internal cells, between the input/output cells if such input/output cells were connected to the first and second output terminals OUT1 and OUT2.

On the other hand, in the differential output circuit 1a, only the NMOS transistors N1 through N5 and the PMOS transistors P1 through P5 may be formed by the transistors having the thick oxide layer such as those used in the input/output cells, and the other transistors may be formed by the silicide transistors having the reduced parasitic resistance in the periphery thereof and suited for the high integration density, so as to protect the differential output circuit 1a from the electrostatic, surge and the like. In addition, it is possible to prevent damage or deterioration to the NMOS transistor N3 and/or the PMOS transistor P3 which may occur when the current is concentrated due to the electrostatic, surge and the like entering the differential output circuit 1a. By not using the silicide transistor and instead using the transistor having the thick oxide layer for the NMOS transistor N12 and the PMOS transistors P11 and P12, current mirror circuits are formed together with the respective NMOS transistor N3 and PMOS transistor P3 using the same kind of transistors. As a result, it is possible to improve the accuracy of the predetermined constant current, and to prevent the deterioration or damage to the NMOS transistor N3 and/or the PMOS transistor P3 which may occur when the current is concentrated due to the electrostatic, surge and the like entering the differential output circuit 1a.

Figure 13:
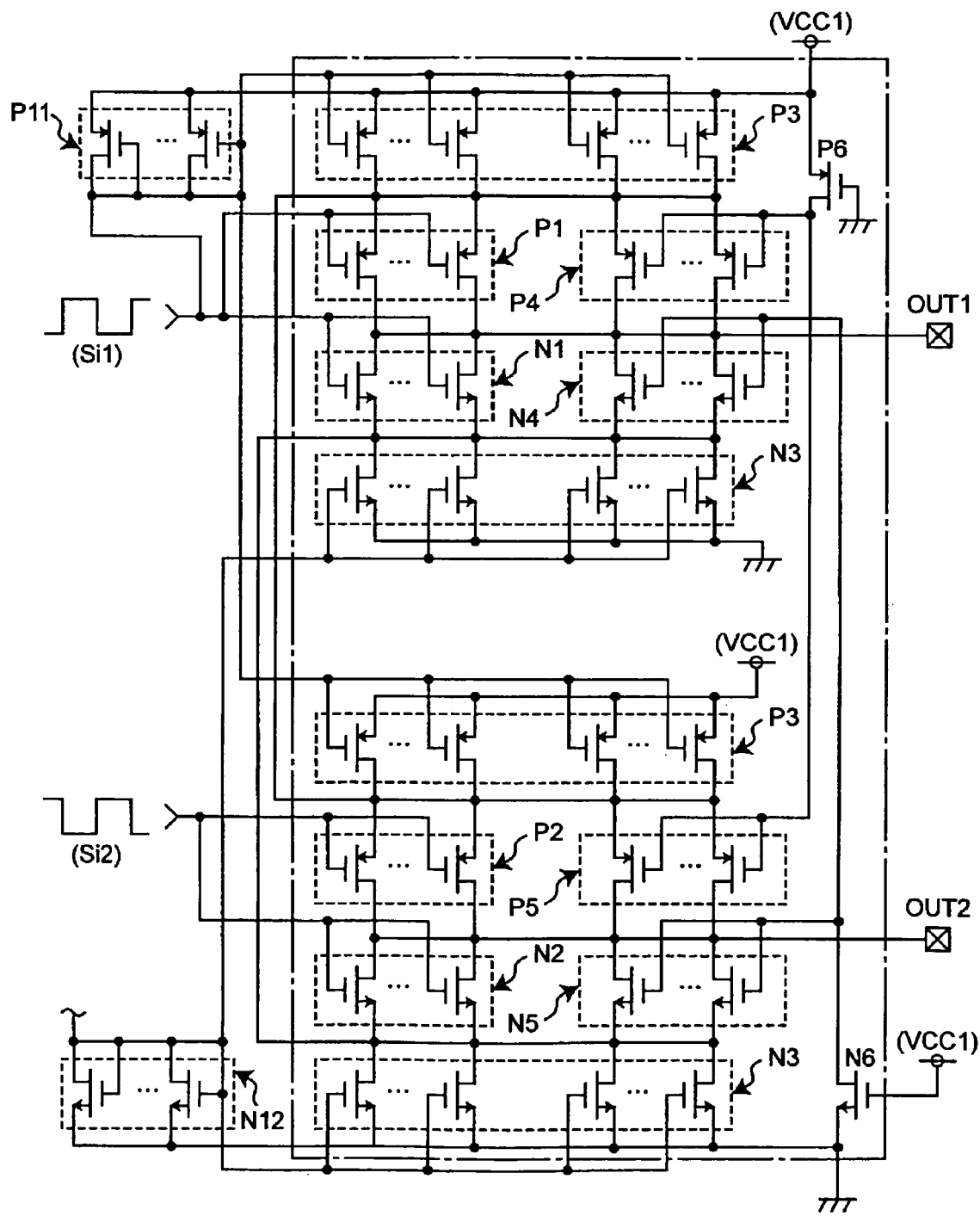
FIG. 13 is a circuit diagram showing a layout of NMOS transistors N1 through N6 and N12 and PMOS transistors P1 through P6 and P11 shown in FIG. 12.

FIG. 13 is a circuit diagram showing a layout of the NMOS transistors N1 through N6 and N12 and the PMOS transistors P1 through P6 and P11 shown in FIG. 12.

As may be seen from FIG. 13, each of the NMOS transistors N1 through N5 and N12 and the PMOS transistors P1 through P5 and P11 is formed by a plurality of transistors that are arranged in parallel. The PMOS transistor P3 is formed by a number of PMOS transistors that is a sum total of the number of transistors forming each of the PMOS transistors P1, P2, P4 and P5. The NMOS transistor N3 is formed by a number of NMOS transistors that is a sum total of the number of transistors forming each of the NMOS transistors N1, N2, N4 and N5. The above structure is employed because the NMOS transistors N1 through N5 and the PMOS transistors P1 through P5 provide a path for passing the electrostatic, surge and the like from the first and second output terminals OUT1 and OUT2 to the first power supply voltage GND and the second power supply voltage vcc1.

The PMOS transistors P1 through P3 and the NMOS transistors N1 through N3 in the differential output circuit 1a must normally have a transistor size that enables a current on the order of several mA to flow. The PMOS transistors P1 through P5 and the NMOS transistors N1 through N5, which provide the path for the electrostatic, surge and the like to pass, have a structure that facilitates distribution of the current so that a large current will not be concentrated at a portion of the transistors arranged in parallel. In addition, since the NMOS transistors N1, N2, N4 and N5 and the PMOS transistors P1, P2, P4 and P5 are connected to either one of the first and second output terminals OUT1 and OUT2 and the electrostatic, surge and the like are directly input thereto, the drain area of each of the NMOS transistors N1, N2, N4 and N5 and the PMOS transistors P1, P2, P4 and P5 is set large. Furthermore, the drain area of the PMOS transistor P3 and the NMOS transistor N3 is similarly set large.

Figure 14:
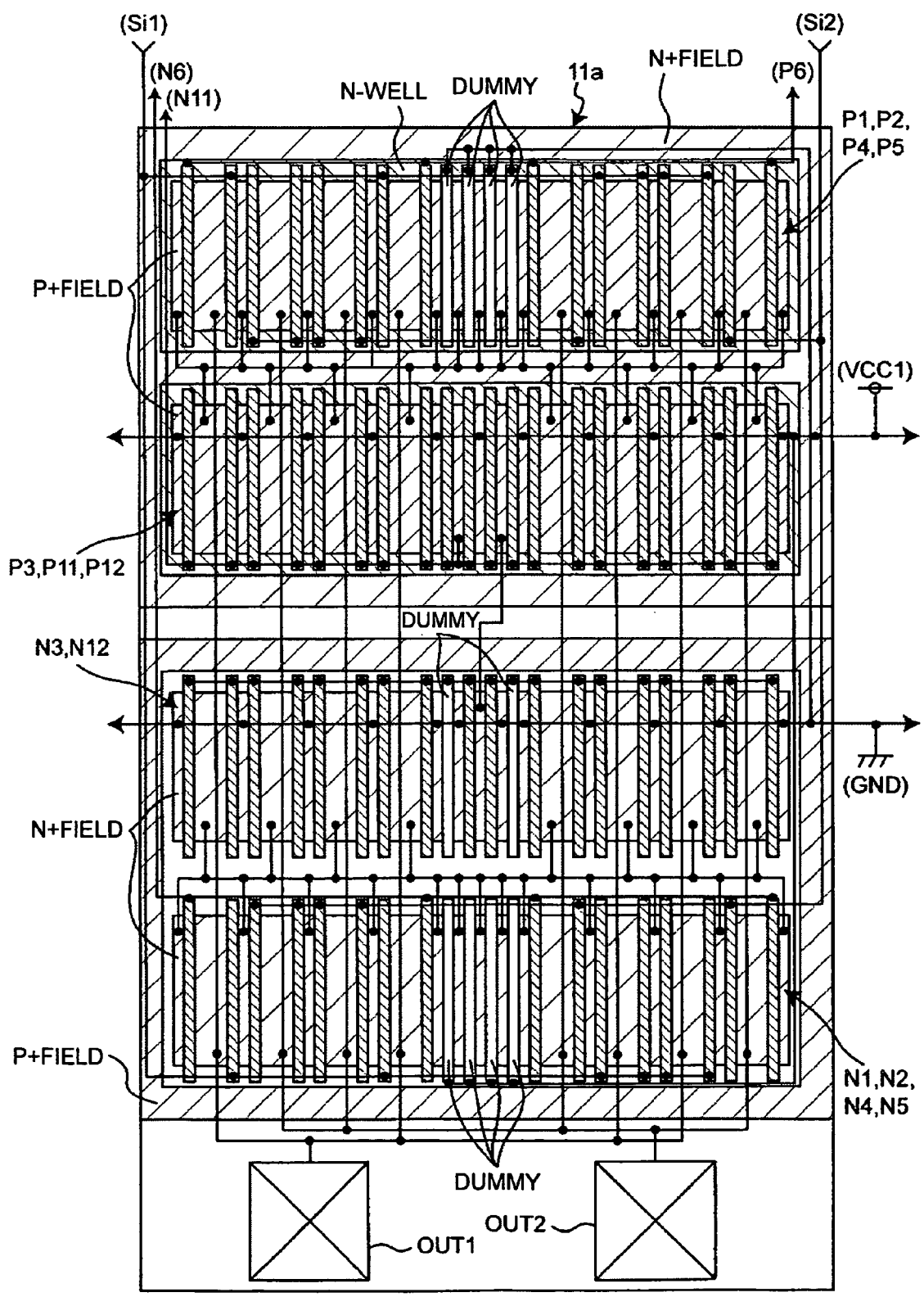
FIG. 14 is a diagram showing an example of a particular layout of the circuit shown in FIG. 13.

FIG. 14 is a diagram showing an example of a particular layout of the circuit shown in FIG. 13.

In FIG. 14, the transistors forming the NMOS transistors N1, N2, N4 and N5 are made of the same polarity (that is, the same N type), same size and same kind. These transistors are formed in parallel, but with the arranging order rearranged so that the transistors form pairs. As a result, the matching accuracy of the transistors is improved, and in addition, the matching accuracy of the parasitic elements in the periphery of the first and second output terminals OUT1 and OUT2 is improved, with respect to inconsistencies introduced during the production process. Therefore, it is possible to obtain from the first and second output terminals OUT1 and OUT2 a differential output having a waveform with a high quality and reduced error.

In addition, since the NMOS transistors N1, N2, N4 and N5 provide the path for passing the electrostatic, surge and the like, and these NMOS transistors N1, N2, N4 and N5 are made up of the transistors having the same shape and the same size in the layout, it is possible to uniformly distribute the electrostatic, surge and the like.

The transistor size may be determined as follows. That is, a reference transistor size, which satisfies the condition to prevent deterioration or damage caused by the electrostatic, surge and the like, is set. Then, the transistor size of the NMOS transistors N1 and N2 is determined with reference to the reference transistor size, by taking into consideration the transistor size that can tolerate the current during the operation and the magnitude of the switching noise. Thereafter, the transistor size of the NMOS transistors N4 and N5 may be determined so that these NMOS transistors N4 and N5 fit within the remaining region (or area) that is available.

Similarly, the transistors forming the NMOS transistor N3 may be arranged in parallel and have the same shape in the layout as the transistors forming the NMOS transistors N1, N2, N4 and N5, so that the current caused by the electrostatic, surge and the like is uniformly distributed with respect to the first power supply voltage GND. Moreover, because the NMOS transistors N3 and N12 form a current mirror circuit, the NMOS transistors N3 and N12 are arranged by considering the two as forming a pair, so that the current flowing to the NMOS transistor N3 has a current value approximating the transistor size ratio of the NMOS transistor N3 with respect to the NMOS transistor N12.

The transistors forming the PMOS transistors P1, P2, P4 and P5 are made of the same polarity (that is, the same P type), same size and same kind. These transistors are formed in parallel, but with the arranging order rearranged so that the transistors form pairs. As a result, the matching accuracy of the transistors is improved, and in addition, the matching accuracy of the parasitic elements in the periphery of the first and second output terminals OUT1 and OUT2 is improved, with respect to inconsistencies introduced during the production process. Therefore, it is possible to obtain from the first and second output terminals OUT1 and OUT2 a differential output having a waveform with a high quality and reduced error.

In addition, since the PMOS transistors P1, P2, P4 and P5 provide the path for passing the electrostatic, surge and the like, and these PMOS transistors P1, P2, P4 and P5 are made up of the transistors having the same shape and the same size in the layout, it is possible to uniformly distribute the electrostatic, surge and the like.

Similarly, the transistors forming the PMOS transistor P3 may be arranged in parallel and have the same shape in the layout as the transistors forming the PMOS transistors P1, P2, P4 and P5, so that the current caused by the electrostatic, surge and the like is uniformly distributed with respect to the second power supply voltage VCC1.

The transistor size may be determined similarly as described above. That is, a reference transistor size, which satisfies the condition to prevent deterioration or damage caused by the electrostatic, surge and the like, is set. Then, the transistor size of the PMOS transistors P1 and P2 is determined with reference to the reference transistor size, by taking into consideration the transistor size that can tolerate the current during the operation and the magnitude of the switching noise. Thereafter, the transistor size of the PMOS transistors P4 and P5 may be determined so that these NMOS transistors P4 and P5 fit within the remaining region (or area) that is available.

Similarly, the transistors forming the PMOS transistor P3 may be arranged in parallel and have the same shape in the layout as the transistors forming the PMOS transistors P1, P2, P4 and P55, so that the current caused by the electrostatic, surge and the like is uniformly distributed with respect to the second power supply voltage VCC1. Moreover, because the PMOS transistor P3 and the PMOS transistors P11 and P12 form a current mirror circuit, the PMOS transistor P3 and the PMOS transistors P11 and P12 are arranged by considering the two as forming a pair, so that the current flowing to the PMOS transistor P3 has a current value approximating the transistor size ratio of the PMOS transistor P3 with respect to the PMOS transistors P11 and P12.

The NMOS transistors N4 and N5 and the PMOS transistors P4 and P5 do not operate during operation of the differential output circuit 1a. When the electrostatic, surge and the like enter the differential output circuit 1a, the NMOS transistors N4 and N5 and the PMOS transistors P4 and P5 provide a path for passing the electrostatic, surge and the like. Since the NMOS transistors N4 and N5 and the PMOS transistors P4 and P5 are formed by the transistors having the same shape and the same size in the layout, it is possible to uniformly distribute the electrostatic, surge and the like. In addition, the transistor size of the NMOS transistors N4 and N5 and the PMOS transistors P4 and P5 may be determined with reference to a reference transistor size, which satisfies the condition to prevent deterioration or damage caused by the electrostatic, surge and the like.

The periphery of the NMOS transistors N1, N2, N4 and N5 is surrounded by a P+ field having the polarity opposite to that of each of these transistors. The periphery of the PMOS transistors P1, P2, P4 and P5 is surrounded by an N+ field having a polarity opposite to that of each of these transistors. Each of the P+ and N+ fields are provided to realize a diode function when the electrostatic, surge and the like enter the differential output circuit 1a, and each of the P+ and N+ fields surrounds the transistors at equal distances from the field within each transistor. The NMOS transistors N1, N2, N4 and N5 and the PMOS transistors P1, P2, P4 and P5 are formed by transistors having a thick oxide layer that are generally used as protection transistors for preventing damage caused by electrostatic discharge or surge within input/output cells, unlike the other transistors within the differential output circuit 1a that are formed by the silicide transistors having a thin oxide layer and reduced parasitic resistance in the periphery of the transistor. Consequently, when the electrostatic, surge and the like enter the differential output circuit 1a, the electrostatic, surge and the like are easily distributed to the peripheral diffusion region (field) surrounding the transistors and having the polarity opposite to that of the transistors.

In FIG. 14, the NMOS transistors N1 through N5 and N12, the PMOS transistors P1 through P5, P11 and P12, a pad forming the first output terminal OUT1 and a pad forming the second output terminal OUT2 form the shape of a single input/output cell in the layout. For this reason, it is possible to improve the area utilization efficiency of the semiconductor chip, by providing an input/output cell-shaped part 11a, which is made up of the NMOS transistors N1 through N5 and N12, the PMOS transistors P1 through P5, P11 and P12, and the pads forming the first and second output terminals OUT1 and OUT2, in an input/output cell region of the integrated circuit. In addition, the distances between the pads forming the first and second output terminals OUT1 and OUT2 and the NMOS transistors N1 and N2 forming the differential pair within the differential output circuit 1a, and the distances between the pads forming the first and second output terminals OUT1 and OUT2 and the PMOS transistors P1 and P2 forming the differential pair within the differential output circuit 1a, can be made short. Hence, it is possible to make the wiring resistance small, and simultaneously make the parasitic resistance due to the wiring resistance small, to thereby realize a high-speed operation of the differential output circuit 1a.

In a general integrated circuit, the input/output cells are arranged so as to surround the periphery of the internal circuits of the integrated circuit in the layout. Wirings for the positive power supply voltage and the negative power supply voltage for the input/output cells are arranged to traverse the input/output cells in a manner surrounding the periphery of the internal circuits of the integrated circuits. For this reason, when the NMOS transistors N1 through N5 and N12, the PMOS transistors P1 through P5, P11 and P12, and the pads forming the first and second output terminals OUT1 and OUT2 are arranged in the input/output cell region in the layout with the input/output cell structure, it is possible to effectively utilize the wiring regions of the positive power supply voltage and the negative power supply voltage, to thereby improve the area utilization efficiency of the semiconductor chip or reduce the semiconductor chip area.

The NMOS transistor N6 is provided to fix the gate voltages of the NMOS transistors N4 and N5, and the PMOS transistor P6 is provided to fix the gate voltages of the PMOS transistors P4 and P5. Hence, although the NMOS transistor N6 and the PMOS transistor P6 shown in FIG. 13 are not illustrated in FIG. 14, the transistor size of the NMOS transistor N6 and the PMOS transistor P6 may be smaller than the transistor size of the NMOS transistors N1, N2, N4 and N5 and the PMOS transistors P1, P2, P4 and P5. Further, since the NMOS transistor N6 and the PMOS transistor P6 may be formed by the same kind of transistors as the internal circuit of the integrated circuit, the NMOS transistor N6 and the PMOS transistor P6 may be arranged within the input/output cell-shaped part 11a shown in FIG. 14 or within the internal circuit of the integrated circuit.

In FIG. 14, the PMOS transistor P12 forming the current mirror circuit may be arranged in the region where the PMOS transistors P3 and P11 are arranged, by considering the PMOS transistor P12 as forming a pair with the PMOS transistors P3 and P11. In FIG. 14, dummy transistors are formed within the region of the NMOS transistors N1, N2, N4 and N5 and within the region of the PMOS transistors P1, P2, P4 and P5, but these dummy transistors may also function as capacitances. In this case, it is possible to suppress a change in the drain part caused by the switching of the transistors forming the differential pair, so that stable differential output signals may be obtained.

Figure 15:
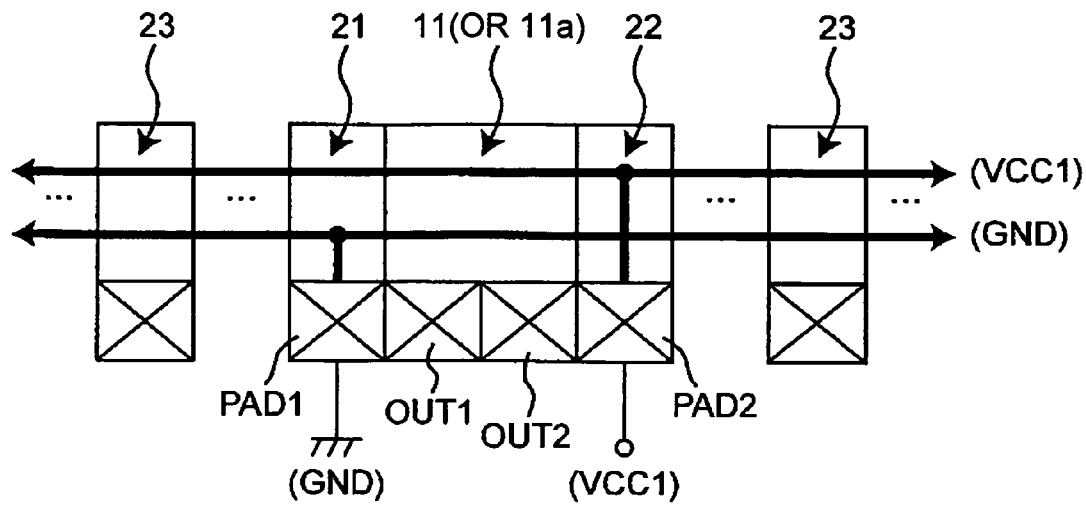
FIG. 15 is a diagram showing an arrangement of input/output cells shown in FIGS. 10 and 11 or FIG. 14.

In a case where the semiconductor integrated circuit includes an internal circuit having a predetermined function and input/output cells which provide an interface between the internal circuit and an external circuit, the input/output cells are normally arranged in the periphery of the internal circuit. Hence, the input/output cell forming part 11 shown in FIGS. 10 and 11 or the input/output cell forming part 11a shown in FIG. 14 may be formed in the input/output cell arranging region of the semiconductor integrated circuit as shown in FIG. 15. FIG. 15 is a diagram showing the arrangement of the input/output cells shown in FIGS. 10 and 11 or FIG. 14. Accordingly, by arranging the input/output cells for the first power supply voltage GND and the input/output cells for the second power supply voltage VCC1 on both sides of the input/output cell forming part 11 or 11a, it is possible to reduce a power supply fluctuation that occurs in the differential output circuit 1 or 1a when the input/output cells for the peripheral digital circuit output operate. In addition, it is possible to eliminate a bypass capacitor for stabilizing the power supply of the differential output circuit 1 or 1a. Moreover, it is possible to reduce the size of the external parts of the differential output circuit 1 or 1a.

Figure 16:
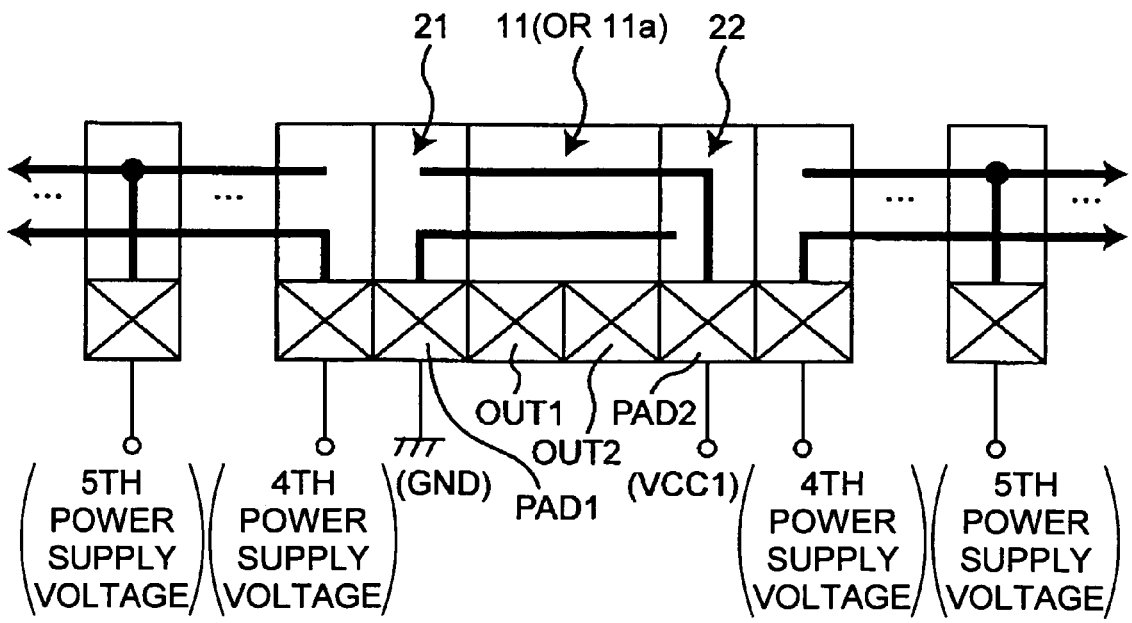
FIG. 16 is a diagram showing another arrangement of the input/output cells shown in FIGS. 10 and 11 or FIG. 14.

FIG. 16 is a diagram showing another arrangement of the input/output cells shown in FIGS. 10 and 11 or FIG. 14. In FIG. 16, a first power supply voltage input terminal PAD1 applied with the first power supply voltage GND and a second power supply voltage input terminal PAD2 applied with the second power supply voltage VCC1 are provided on respective sides of the input/output cell forming part 11 or 11a of the differential output circuit 1 or 1a. The power supply voltages of the other input/output cells may be made different from the first power supply voltage GND and the second power supply voltage VCC1. In this case, it is possible to separate the input/output cell forming part 11 or 11a of the differential output circuit 1 or 1a from the power supplies of the other circuits. In addition, a common impedance with the power supply wiring of the input/output cells for the peripheral digital circuit output can be eliminated, and it is possible to suppress the effects of the power supply fluctuation when the input/output cells for the peripheral digital circuit operate.

Therefore, when the differential output circuit 1 or 1a uses the LVDS circuit, the NMOS transistors N1 and N4 forming the differential pair are connected in parallel, and the NMOS transistors N2 and N5 forming the differential pair are connected in parallel. In addition, the gates of the NMOS transistors N4 and N5 are connected to the first power supply voltage GND via the NMOS transistor N6 having the gate thereof connected to the second power supply voltage VCC1. The PMOS transistors P1 and P4 forming the differential pair are connected in parallel, and the PMOS transistors P2 and P5 forming the differential pair are connected in parallel. Further, the gates of the PMOS transistors P4 and P5 are connected to the second power supply voltage VCC1 via the PMOS transistor P6 having the gate thereof connected to the first power supply voltage GND. Hence, it is possible to prevent inconveniences caused by the electrostatic, surge and the like, improve the quality of the differential output signals and the high-speed operation of the differential output circuit 1 or 1a, and reduce the semiconductor chip area.

This application claims the benefit of a Japanese Patent Application No. 2005-053822 filed Feb. 28, 2005, in the Japanese Patent Office, the disclosure of which is hereby incorporated by reference.

Further, the present invention is not limited to these embodiments, but various variations and modifications may be made without departing from the scope of the present invention.

What is claimed is:

1. A differential output circuit for generating a pair of binary signals having mutually inverted logic signal levels in response to an input signal and outputting the pair of signals via first and second output terminals, comprising:

a first transistor, coupled between the first output terminal and a predetermined first power supply voltage, and having a control electrode input with one of the binary signals;

a second transistor, coupled between the second output terminal and the predetermined first power supply voltage, configured to form a differential pair with the first transistor and having a control electrode input with the other of the binary signals;

a constant current circuit configured to generate a predetermined constant current that is supplied to the first and second transistors; and a protection circuit configured to protect the first and second transistors from external noise, wherein the protection circuit comprises:
a fifth transistor, coupled in parallel to the first transistor, and having a control electrode input with the first power supply voltage;
a sixth transistor, coupled in parallel to the second transistor, and having a control electrode input with the first power supply voltage;
an eighth transistor, coupled between the second power supply voltage and the first output terminal, and having a control electrode input with the second power supply voltage; and
a ninth transistor, coupled between the second power supply voltage and the second output terminal, and having a control electrode input with the second power supply voltage.

2. The differential output circuit as claimed in claim 1, wherein the protection circuit further comprises:
a seventh transistor, coupled between the first power supply voltage and a node connecting the control electrodes of the fifth and sixth transistors, and having a control electrode connected to the second power supply voltage; and
a tenth transistor, coupled between the second power supply voltage and a node connecting the control electrodes of the eighth and ninth transistors, and having a control electrode connected to the first power supply voltage.

3. The differential output circuit as claimed in claim 1, wherein the first, second, fifth, sixth, eighth and ninth transistors are respectively formed by a plurality of transistors, of identical size and shape, that are coupled in parallel.

4. The differential output circuit as claimed in claim 3, the first, second, fifth, sixth, eighth and ninth transistors form a shape of an input/output cell together with a first pad forming the first output terminal and a second pad forming the second output terminal.

5. The differential output circuit as claimed in claim 4, wherein:
the first, second, fifth and sixth transistors are formed by identical kinds of transistors;
the eighth and ninth transistors are formed by identical kinds of transistors; and
the first, second, fifth and sixth transistors, and the eighth and ninth transistors, both have a field formed in a periphery thereof with a polarity opposite to that of each transistor.

6. The differential output circuit as claimed in claim 3, wherein the constant current circuit comprises:
eleventh and twelfth transistors forming a current mirror circuit that supplies the generated constant current to the first and second transistors,
wherein the eleventh and twelfth transistors are respectively formed by a plurality of transistors, of identical size and shape, that are coupled in parallel.

7. The differential output circuit as claimed in claim 6, wherein the first, second, fifth, sixth eighth, ninth, eleventh and twelfth transistors form a shape of an input/output cell together with a first pad forming the first output terminal and a second pad forming the second output terminal.

8. The differential output circuit as claimed in claim 7, wherein:
the first, second, fifth and sixth transistors are formed by identical kinds of transistors;
the eighth and ninth transistors are formed by identical kinds of transistors;
the eleventh and twelfth transistors are formed by identical kinds of transistors; and
the first, second, fifth and sixth transistors, the eighth and ninth transistors, and the eleventh and twelfth transistors, respectively have a field formed in a periphery thereof with a polarity opposite to that of each transistor.

9. A differential output circuit for generating a pair of binary signals having mutually inverted logic signal levels in response to an input signal and outputting the pair of signals via first and second output terminals, comprising:
a first transistor, coupled between the first output terminal and a predetermined first power supply voltage, and having a control electrode input with one of the binary signals;
a second transistor, coupled between the second output terminal and the predetermined first power supply voltage, configured to form a differential pair with the first transistor and having a control electrode input with the other of the binary signals;
a third transistor, coupled between the first output terminal and a predetermined second power supply voltage, having a control electrode input with the one of the binary signals;
a fourth transistor, coupled between the second output terminal and the second power supply voltage, having a control electrode input with the other of the binary signals;
a constant current circuit configured to generate a predetermined constant current that is supplied to the first and second transistors, and to generate a predetermined constant current that is supplied to the third and fourth transistors; and
a protection circuit configured to protect the first, second, third and fourth transistors from external noise,
wherein the protection circuit comprises:
a fifth transistor, coupled in parallel to the first transistor, and having a control electrode input with the first power supply voltage;
a sixth transistor, coupled in parallel to the second transistor, and having a control electrode input with the first power supply voltage;
an eighth transistor, coupled in parallel to the third transistor, and having a control electrode input with the second power supply voltage; and
a ninth transistor, coupled in parallel to the fourth transistor, and having a control electrode input with the second power supply voltage.

10. The differential output circuit as claimed in claim 9, wherein the protection circuit further comprises:
a seventh transistor, coupled between the first power supply voltage and a node connecting the control electrodes of the fifth and sixth transistors, and having a control electrode coupled to the second power supply voltage; and
a tenth transistor, coupled between the second power supply voltage and a node connecting the control electrodes of the eighth and ninth transistors, having a control electrode coupled to the first power supply voltage.

11. The differential output circuit as claimed in claim 9, wherein the first, second, third, fourth, fifth, sixth, eighth and ninth transistors are respectively formed by a plurality of transistors, of identical size and shape, that are coupled in parallel.

12. The differential output circuit as claimed in claim 11, wherein the constant current circuit further comprises:

eleventh and twelfth transistors forming a first current mirror circuit that supplies the generated constant current to the first and second transistors, wherein the eleventh and twelfth transistors are respectively formed by a plurality of transistors, of identical size and shape, that are coupled in parallel.

13. The differential output circuit as claimed in claim 12, wherein the constant current circuit further comprises:

thirteenth and fourteenth transistors forming a second current mirror circuit that supplies the generated constant current to the third and fourth transistors, wherein the thirteenth and fourteenth transistors are respectively formed by a plurality of transistors, of identical size and shape, that are coupled in parallel.

14. The differential output circuit as claimed in claim 13, wherein the first, second, third, fourth, fifth, sixth, eighth, ninth, eleventh, twelfth, thirteenth and fourteenth transistors form a shape of an input/output cell together with a first pad forming the first output terminal and a second pad forming the second output terminal.

15. The differential output circuit as claimed in claim 14, wherein:

the first, second, fifth and sixth transistors are formed by identical kinds of transistors;

the third, fourth, eighth and ninth transistors are formed by identical kinds of transistors;

the eleventh and twelfth transistors are formed by identical kinds of transistors;

the thirteenth and fourteenth transistors are formed by identical kinds of transistors; and the first, second, fifth and sixth transistors, the third, fourth, eighth and ninth transistors, the eleventh and twelfth transistors, and the thirteenth and fourteenth transistors, respectively have a field formed in a periphery thereof with a polarity opposite to that of each transistor.

16. The differential output circuit as claimed in claim 4, wherein input/output cells for the first power supply that are input with the first power supply voltage and input/output cells for the second power supply that are input with the second power supply voltage are arranged on respective side of a portion forming the shape of the input/output cell.

17. The differential output circuit as claimed in claim 7, wherein input/output cells for the first power supply that are input with the first power supply voltage and input/output cells for the second power supply that are input with the second power supply voltage are arranged on respective side of a portion forming the shape of the input/output cell.

18. The differential output circuit as claimed in claim 14, wherein input/output cells for the first power supply that are input with the first power supply voltage and input/output cells for the second power supply that are input with the second power supply voltage are arranged on respective side of a portion forming the shape of the input/output cell.

19. A semiconductor device comprising a differential output circuit configured to generate a pair of binary signals having mutually inverted logic signal levels in response to an input signal and outputting the pair of signals via first and second output terminals, said differential output circuit comprising:

a first transistor, coupled between the first output terminal and a predetermined first power supply voltage, and having a control electrode input with one of the binary signals;

a second transistor, coupled between the second output terminal and the predetermined first power supply voltage, configured to form a differential pair with the first transistor and having a control electrode input with the other of the binary signals;

a constant current circuit configured to generate a predetermined constant current that is supplied to the first and second transistors; and a protection circuit configured to protect the first and second transistors from external noise, wherein the protection circuit comprises:

a fifth transistor, coupled in parallel to the first transistor, and having a control electrode input with the first power supply voltage;

a sixth transistor, coupled in parallel to the second transistor, and having a control electrode input with the first power supply voltage;

an eighth transistor, coupled between the second power supply voltage and the first output terminal, and having a control electrode input with the second power supply voltage; and a ninth transistor, coupled between the second power supply voltage and the second output terminal, and having a control electrode input with the second power supply voltage.

20. The semiconductor device as claimed in claim 19, wherein the protection circuit further comprises:

a seventh transistor, coupled between the first power supply voltage and a node connecting the control electrodes of the fifth and sixth transistors, and having a control electrode connected to the second power supply voltage; and a tenth transistor, coupled between the second power supply voltage and a node connecting the control electrodes of the eighth and ninth transistors, and having a control electrode connected to the first power supply voltage.

21. A semiconductor device comprising a differential output circuit configured to generate a pair of binary signals having mutually inverted logic signal levels in response to an input signal and outputting the pair of signals via first and second output terminals, said differential output circuit comprising:

a first transistor, coupled between the first output terminal and a predetermined first power supply voltage, and having a control electrode input with one of the binary signals;

a second transistor, coupled between the second output terminal and the predetermined first power supply voltage, configured to form a differential pair with the first transistor and having a control electrode input with the other of the binary signals;

a third transistor, coupled between the first output terminal and a predetermined second power supply voltage, having a control electrode input with the one of the binary signals;

a fourth transistor, coupled between the second output terminal and the second power supply voltage, having a control electrode input with the other of the binary signals;

a constant current circuit configured to generate a predetermined constant current that is supplied to the first and second transistors, and to generate a predetermined constant current that is supplied to the third and fourth transistors; and a protection circuit configured to protect the first, second, third and fourth transistors from external noise, wherein the protection circuit comprises:
- a fifth transistor, coupled in parallel to the first transistor, and having a control electrode input with the first power supply voltage;
- a sixth transistor, coupled in parallel to the second transistor, and having a control electrode input with the first power supply voltage;
- an eighth transistor, coupled in parallel to the third transistor, and having a control electrode input with the second power supply voltage; and
- a ninth transistor, coupled in parallel to the fourth transistor, and having a control electrode input with the second power supply voltage.

22. The semiconductor device as claimed in claim 21, wherein the protection circuit further comprises:
- a seventh transistor, coupled between the first power supply voltage and a node connecting the control electrodes of the fifth and sixth transistors, and having a control electrode connected to the second power supply voltage; and
- a tenth transistor, coupled between the second power supply voltage and a node connecting the control electrodes of the eighth and ninth transistors, and having a control electrode connected to the first power supply voltage.

* * * * *